United States Patent
Pang et al.

(10) Patent No.: US 10,121,809 B2
(45) Date of Patent: Nov. 6, 2018

(54) BACKSIDE-ILLUMINATED COLOR IMAGE SENSORS WITH CROSSTALK-SUPPRESSING COLOR FILTER ARRAY

(71) Applicant: OmniVision Technologies, Inc., Santa Clara, CA (US)

(72) Inventors: Chin-Poh Pang, Pleasanton, CA (US);
Boyang Zhang, San Jose, CA (US);
Chia-Ying Liu, Hsinchu (TW);
Wu-Zang Yang, ShiHu Town (TW);
Chih-Wei Hsiung, San Jose, CA (US);
Chun-Yung Ai, Taipei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/264,411

(22) Filed: Sep. 13, 2016

(65) Prior Publication Data
US 2018/0076247 A1    Mar. 15, 2018

(51) Int. Cl.
*H01L 27/146*    (2006.01)
*H04N 5/374*    (2011.01)
*H04N 9/04*    (2006.01)

(52) U.S. Cl.
CPC .... *H01L 27/14623* (2013.01); *H01L 27/1464* (2013.01); *H01L 27/14621* (2013.01); *H01L 27/14627* (2013.01); *H01L 27/14629* (2013.01); *H01L 27/14645* (2013.01); *H01L 27/14685* (2013.01); *H04N 5/374* (2013.01); *H04N 9/045* (2013.01)

(58) Field of Classification Search
CPC ......... H01L 27/14621; H01L 27/14627; H01L 27/14636; H01L 27/1464; H01L 27/14645
See application file for complete search history.

(56) References Cited

U.S. PATENT DOCUMENTS

| | | | |
|---|---|---|---|
| 8,269,264 B2 | 9/2012 | Nozaki et al. | |
| 8,507,964 B2 | 8/2013 | Nozaki et al. | |
| 8,530,266 B1 | 9/2013 | Chen et al. | |
| 2012/0043634 A1 | 2/2012 | Kurihara | |
| 2013/0307107 A1 | 11/2013 | Tsai et al. | |
| 2014/0339606 A1 | 11/2014 | Lin et al. | |
| 2014/0339615 A1 | 11/2014 | Wang et al. | |

OTHER PUBLICATIONS

Han_Lin et al., 1um Back-Side Illuminated Image Sensor Performance Improvement, 2013 International Image Sensor Workshop; Jun. 2013.

*Primary Examiner* — Tony Tran
(74) *Attorney, Agent, or Firm* — Lathrop Gage LLP

(57) ABSTRACT

A backside-illuminated color image sensor with crosstalk-suppressing color filter array includes (a) a silicon layer including an array of photodiodes and (b) a color filter layer on the light-receiving surface of the silicon layer, wherein the color filter layer includes (i) an array of color filters cooperating with the array of photodiodes to form a respective array of color pixels and (ii) a light barrier grid disposed between the color filters to suppress transmission of light between adjacent ones of the color filters. The light barrier is spatially non-uniform across the color filter layer to account for variation of chief ray angle across the array of color filters.

10 Claims, 19 Drawing Sheets

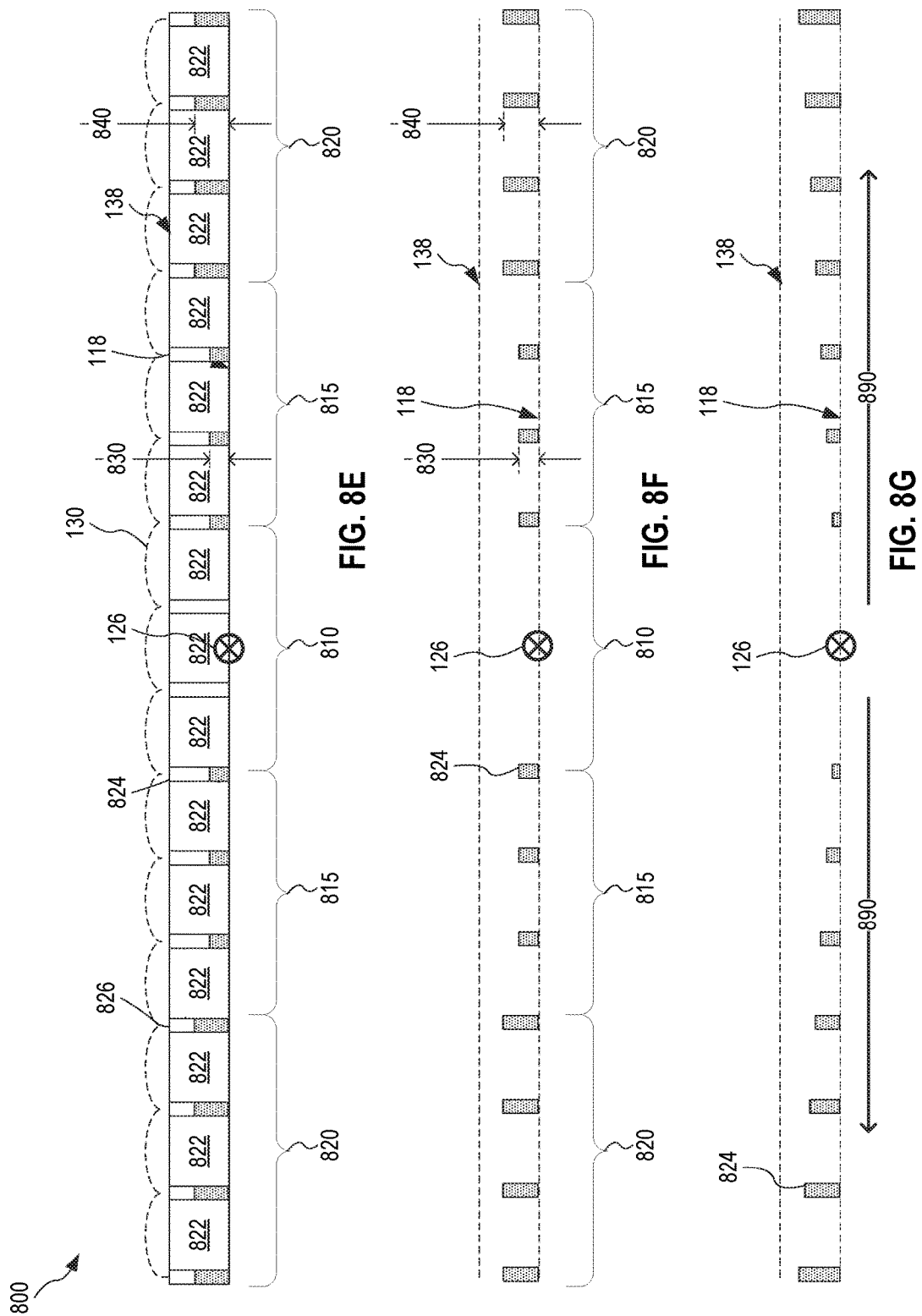

1000

FORM AN ARRAY OF COLOR FILTERS AND A METAL GRID ON LIGHT-RECEIVING SURFACE OF A SILICON SUBSTRATE INCLUDING AN ARRAY OF PHOTODIODES TO PRODUCE A COLOR PIXEL ARRAY WITH PARTIAL CROSSTALK SUPPRESSION
1010

DEPOSIT METAL ON THE LIGHT-RECEIVING SURFACE TO FORM THE METAL GRID
1012

DEPOSIT THE ARRAY OF COLOR FILTERS
1014

DEPOSIT A DIELECTRIC MATERIAL ON THE COLOR PIXEL ARRAY TO INTEGRALLY FORM (A) AN ARRAY OF MICROLENSES FOR THE COLOR PIXEL ARRAY AND (B) A TOTAL-INTERNAL-REFLECTION BASED LIGHT BARRIER FILLING SPACES BETWEEN THE COLOR FILTERS NOT OCCUPIED BY THE METAL GRID
1020

FIG. 10

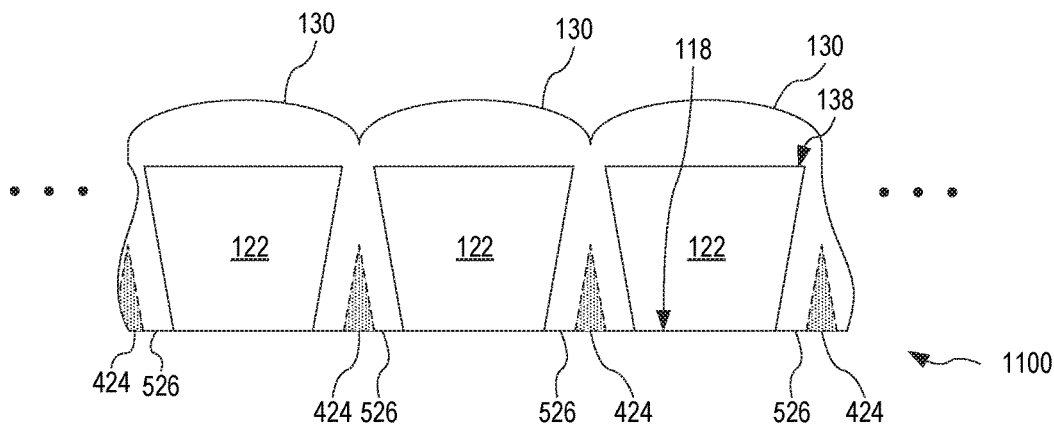

```
┌─────────────────────────────────────────────────────────────────────────┐
│  FORM AN ARRAY OF COLOR FILTERS AND A METAL GRID ON LIGHT-RECEIVING SURFACE │
│  OF A SILICON SUBSTRATE INCLUDING AN ARRAY OF PHOTODIODES TO PRODUCE A COLOR │
│            PIXEL ARRAY WITH PARTIAL CROSSTALK SUPPRESSION                │
│                                  1210                                    │
│  ┌───────────────────────────────────────────────────────────────────┐  │
│  │   DEPOSIT METAL ON THE LIGHT-RECEIVING SURFACE TO FORM THE METAL GRID │  │
│  │                               1012                                │  │
│  └───────────────────────────────────────────────────────────────────┘  │
│                                    │                                     │
│                                    ▼                                     │
│  ┌───────────────────────────────────────────────────────────────────┐  │
│  │  DEPOSIT THE ARRAY OF COLOR FILTERS WITH WIDTH INCREASING WITH DISTANCE │  │
│  │            AWAY FROM CENTER OF THE ARRAY OF COLOR FILTERS         │  │
│  │                               1214                                │  │
│  │  ┌─────────────────────────┐  ┌─────────────────────────┐        │  │
│  │  │  PRODUCE THE ARRAY OF COLOR │  │  PRODUCE THE ARRAY OF COLOR │        │  │
│  │  │  FILTERS WITH SPACING BETWEEN│  │  FILTERS WITH SPACING BETWEEN│        │  │
│  │  │  ADJACENT COLOR FILTERS, AT THE│  │  ADJACENT COLOR FILTERS BEING│        │  │
│  │  │  CENTER OF THE ARRAY, BEING │  │  ZERO AT POSITIONS MOST DISTANT│        │  │
│  │  │  SAME AS WIDTH OF THE METAL │  │        FROM THE CENTER     │        │  │
│  │  │             GRID            │  │             1218            │        │  │
│  │  │             1216            │  │                             │        │  │
│  │  └─────────────────────────┘  └─────────────────────────┘        │  │
│  └───────────────────────────────────────────────────────────────────┘  │
└─────────────────────────────────────────────────────────────────────────┘
                                    │
                                    ▼
┌─────────────────────────────────────────────────────────────────────────┐
│  DEPOSIT A DIELECTRIC MATERIAL ONTO THE COLOR PIXEL ARRAY TO INTEGRALLY FORM │
│   (A) AN ARRAY OF MICRO LENSES FOR THE COLOR PIXEL ARRAY AND (B) A REFLECTIVE│
│   LIGHT BARRIER FILLING SPACES BETWEEN THE COLOR FILTERS NOT OCCUPIED BY THE │
│                               METAL GRID                                 │
│                                  1020                                    │
└─────────────────────────────────────────────────────────────────────────┘
```

```
┌─────────────────────────────────────────────────────────────────────────┐
│  FORM AN ARRAY OF COLOR FILTERS AND A METAL GRID ON LIGHT-RECEIVING     │
│  SURFACE OF A SILICON SUBSTRATE INCLUDING AN ARRAY OF PHOTODIODES TO    │
│  PRODUCE A COLOR PIXEL ARRAY WITH PARTIAL CROSSTALK SUPPRESSION         │
│                              1010                                        │
│  ┌───────────────────────────────────────────────────────────────────┐  │
│  │  DEPOSIT METAL ON THE LIGHT-RECEIVING SURFACE TO FORM THE         │  │
│  │  METAL GRID                                                        │  │
│  │                         1012                                       │  │
│  └───────────────────────────────┬───────────────────────────────────┘  │
│                                  ▼                                       │
│  ┌───────────────────────────────────────────────────────────────────┐  │
│  │           DEPOSIT THE ARRAY OF COLOR FILTERS                       │  │
│  │                         1014                                       │  │
│  └───────────────────────────────────────────────────────────────────┘  │
└──────────────────────────────────┬──────────────────────────────────────┘
                                   ▼
┌─────────────────────────────────────────────────────────────────────────┐
│  DEPOSIT A FIRST DIELECTRIC MATERIAL ONTO THE COLOR PIXEL ARRAY TO       │
│  FORM A TOTAL-INTERNAL-REFLECTION BASED LIGHT BARRIER FILLING SPACES     │
│  BETWEEN THE COLOR FILTERS NOT OCCUPIED BY THE METAL GRID                │
│                              1710                                        │
└──────────────────────────────────┬──────────────────────────────────────┘
                                   ▼
┌─────────────────────────────────────────────────────────────────────────┐
│  DEPOSIT A SECOND DIELECTRIC MATERIAL ON LIGHT-RECEIVING SURFACE OF      │
│  THE COLOR PIXEL ARRAY TO FORM AN ARRAY OF MICRO LENSES FOR THE          │
│  COLOR PIXEL ARRAY                                                       │
│                              1720                                        │
└─────────────────────────────────────────────────────────────────────────┘
```

FIG. 17

BACKSIDE-ILLUMINATED COLOR IMAGE SENSORS WITH CROSSTALK-SUPPRESSING COLOR FILTER ARRAY

BACKGROUND

Digital image sensors implement an array of photodiodes and electrical connections connecting the photodiodes to readout electronics onboard the image sensor. In a traditional frontside-illuminated image sensor, the electrical connections are placed closer than the photodiode array to the light-receiving surface of the image sensor, such that light from the scene must pass through a wiring layer (accommodating the electrical connections) before reaching the photodiode array. This prevents detection of a significant fraction of incoming light. Backside-illuminated image sensors solve this problem by flipping the silicon substrate and thinning the backside of the silicon substrate to allow for light to enter through the backside and be detected by the photodiode array without first having to pass through the wiring layer. As a result, backside-illuminated image sensors may achieve higher sensitivity than frontside-illuminated image sensors.

However, the architecture of backside-illuminated image sensors presents challenges. For example, the silicon substrate of a backside-illuminated image sensor is significantly thinner than that of a frontside-illuminated image sensor, which renders backside-illuminated image sensors more fragile than frontside-illuminated image sensors. Another challenge is increased crosstalk between adjacent photodiodes in the absence of a wiring layer to provide at least partial light blockage between light propagation paths associated with different photodiodes. In color-sensitive backside-illuminated image sensors, such optical crosstalk may lead to color mixing and thus reduced color clarity in captured images.

SUMMARY

In an embodiment, a backside-illuminated color image sensor with crosstalk-suppressing color filter array includes a silicon layer and a color filter layer on the light-receiving surface of the silicon layer. The silicon layer includes an array of photodiodes. The color filter layer includes an array of color filters cooperating with the array of photodiodes to form a respective array of color pixels. The color filter layer further includes a light barrier grid disposed between the color filters to suppress transmission of light between adjacent ones of the color filters. The light barrier is spatially non-uniform across the color filter layer to account for variation of chief ray angle across the array of color filters.

In an embodiment, a method for manufacturing a backside-illuminated color image sensor with crosstalk-suppressing color filter array includes forming an array of color filters and a metal grid on light-receiving surface of a silicon substrate including an array of photodiodes to produce a color pixel array. The metal grid is disposed between at least some of the color filters to provide partial crosstalk suppression. The method further includes depositing a first dielectric material, having lower index of refraction than the color filters, onto the color pixel array to integrally form (a) an array of microlenses for the color pixel array and (b) a total-internal-reflection based light barrier filling spaces between the color filters not occupied by the metal grid.

BRIEF DESCRIPTION OF THE DRAWINGS

FIGS. 8A-G illustrate a crosstalk-suppressing color filter layer with a stacked metal/low-n material light barrier grid, wherein the height of the metal portion is spatially non-uniform across light barrier grid, according to an embodiment.

FIG. 10 illustrates a method for manufacturing a backside-illuminated color image sensor with a crosstalk-suppressing color filter array, according to an embodiment.

FIG. 11 illustrates a crosstalk-suppressing color filter layer having low-n material integrally formed with microlenses, according to an embodiment.

FIG. 12 illustrates a method for manufacturing a backside-illuminated color image sensor with a spatially non-uniform crosstalk-suppressing color filter array, according to an embodiment.

FIG. 17 illustrates a method for manufacturing a backside-illuminated color image sensor with a crosstalk-suppressing color filter array, wherein low-n material of a crosstalk-suppressing light barrier grid and microlenses are formed separately, according to an embodiment.

DETAILED DESCRIPTION OF THE EMBODIMENTS

Figure 1:
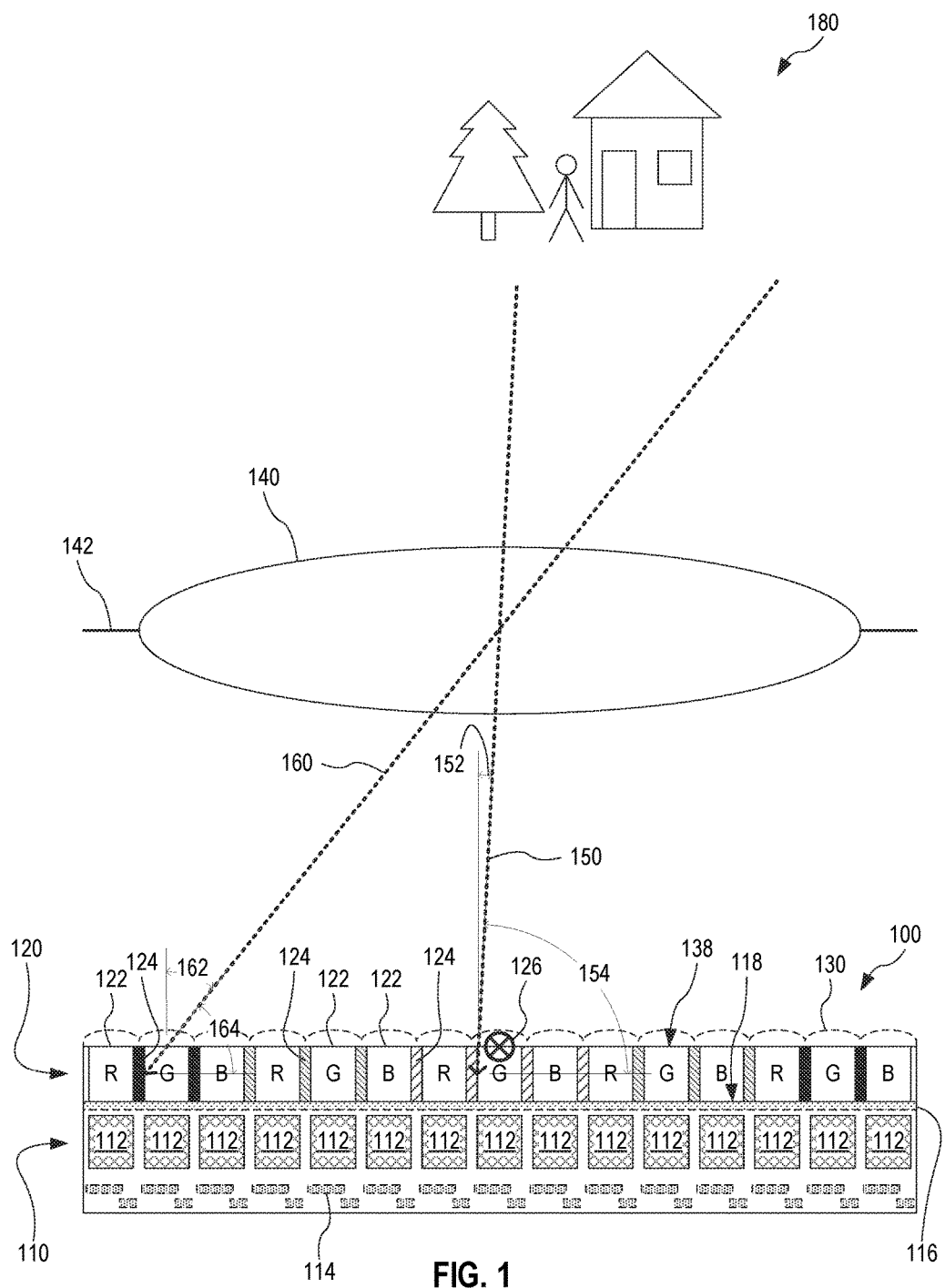
FIG. 1 illustrates a backside-illuminated color image sensor with a crosstalk-suppressing color filter array, according to an embodiment.

FIG. 1 illustrates one exemplary backside-illuminated color image sensor 100 with a crosstalk-suppressing color filter array. Image sensor 100 is a color-sensitive complementary metal oxide semiconductor (CMOS) image sensor and includes a silicon layer 110 and a color filter layer 120 disposed on light-receiving surface 118 of silicon layer 110. Silicon layer 110 includes an array of photodiodes 112, each of which generates electrical charge in response to incident light. Color filter layer 120 includes an array of color filters 122 and a light barrier grid 124. The array of color filters 122 is registered to the array of photodiodes 112, such that each color filter 122 cooperates with a corresponding photodiode 112 to form a color pixel, i.e., a pixel that is sensitive to light in a certain wavelength range. FIG. 1 shows image sensor 100 in cross-sectional side view, wherein the cross section is in a plane orthogonal to light-receiving surface 118. For clarity of illustration, not all color filters 122 and not all portions of light barrier grid 124 are labeled in FIG. 1.

Silicon layer 110 may further include electrical connections 114 connecting photodiodes 112 to readout electronics. Electrical connections 114 are on the side of photodiodes 112 opposite light-receiving surface 118, such that light propagating toward photodiodes 112 from a scene 180 does not pass through the layer of electrical connections 114. In addition, silicon layer 110 may include a passivation layer 116 at the interface with color filter layer 120. In certain embodiments, image sensor 100 further includes an array of microlenses 130 disposed on color filter layer 120 to focus light incident on light-receiving surface 138 of color filter layer 120 at a given color filter 122 onto the associated photodiode 112.

Light barrier grid 124 is placed between adjacent color filters 122 to suppress transmission of light between adjacent color filters 122. In the absence of light barrier grid 124, light may from a scene 180 may enter one color filter 122 associated with one color pixel of image sensor 100 and propagate to an adjacent color filter 122 prior to reaching light-receiving surface 118. This process causes crosstalk (such as optical crosstalk) between adjacent color pixels. Light barrier grid 124 serves to suppress such crosstalk to provide improved color clarity and resolution in general. Thus, color filter layer 120 functions as a crosstalk-suppressing color filter array. Light barrier grid 124 is spatially non-uniform across the array to account for the differences in angles of incidence for light entering color filter layer 120 from a scene 180. Herein, "spatially non-uniform" light barrier grid is a light barrier grid having at least one property that varies across the color filter array, such that the configuration of the light barrier grid is not the same between all color filters of the color filter array. A spatially non-uniform light barrier grid, as disclosed herein, may exhibit such variation in one or more geometrical parameters (for example height, width, and/or shape) and/or in composition.

Generally, the angle of incidence of light from a scene 180 onto color filter layer 120 increases in the direction away from center 126 of the array of color filters 122 and toward the edges of the array of color filters 122. FIG. 1 shows two exemplary chief rays 150 and 160. Each of chief rays 150 and 160 passes through the center of an aperture stop 142 of an imaging objective 140 used to image scene 180 onto image sensor 100. Imaging objective 140 may be a single lens, as shown in FIG. 1, a pinhole lens, or a composite imaging objective including multiple optical elements, without departing from the scope hereof. Chief ray 150 is incident on color filter layer 120 near center 126, and incidence angle 152 (chief ray angle 152) of chief ray 150 is relatively small. Chief ray 160 is incident on color filter layer 120 at a more peripheral location, and incidence angle 162 (chief ray angle 162) of chief ray 160 is greater than incidence angle 152. At least one property of light barrier grid 124 changes as a function of distance away from center 126, to account for the change in chief ray angle as a function of this distance and provide good crosstalk (such as optical crosstalk) suppression across the full array of color filters 122. Herein, "incidence angle" is defined as the angle between the incoming light and the normal vector of the interface or surface on which the incoming light is incident.

In one embodiment, light barrier grid 124 includes metal and a low index-of-refraction (low-n) material. Herein, a "low-n material" refers to a dielectric material that is substantially transparent, or at least partly transmissive, to light in the sensitivity range of image sensor 100 and has index of refraction lower than the index of refraction of color filters 122. In one implementation, the index of refraction of the low-n material is less than 1.55, for example in the range from 1.4 to 1.52, and the index of refraction of color filters 122 is about 1.7 or greater. The metal generally may partly reflect light incident thereon, such that a portion of light incident on a metal portion of light barrier grid 124 from an adjacent color filter 122 is reflected back into the same color filter 122. However, at least a significant fraction, for example the majority or more than 90%, of the light is absorbed by the metal and therefore fails detection by the associated photodiode 112. Consequently, metal may reduce the sensitivity of image sensor 100 and may therefore counteract a primary benefit of image sensor 100 being backside-illuminated. Since the index of refraction of the low-n material is lower than that of color filters 122, light incident onto the low-n material from a color filter 122 may undergo total internal reflection and be reflected back into the same color filter without experiencing any absorption loss. Total internal reflection takes place at angles of incidence (onto light barrier grid 124) greater than the critical angle of total internal reflection, i.e., at angles of incidence that are further than the critical angle from normal incidence, such as a glancing angle. At angles less than the critical angle (i.e., at angles closer than the critical angle to normal incidence), one fraction of the light is reflected back into the color filter 122 from which the light came, while the remaining fraction is transmitted into the low-n material, and potentially to a different color filter 122. Thus, at incidence angles greater than the critical angle, low-n material at the interface with color filter 122 is superior to metal since the low-n material avoids the absorption loss of the metal. However, at incidence angles less than the critical angle, metal may be preferred over the low-n material at the interface with color filter 122 to avoid crosstalk caused by light transmission by the low-n material. The critical angle for total internal reflection (measured relative to normal incidence) at the color filter to low-n material interface is $\sin^{-1}(n_1/n_2)$, wherein $n_1$ is the index of refraction of the low-n material and $n_2$ is the index of refraction of the color filter. In one example, $n_1$ is between 1.4 and 1.55 and $n_2$ is 1.7 or greater, in which case the critical angle for total internal reflection is between 55 and 65 degrees. Between any two adjacent color filters 122, light barrier grid 124 may implement metal, low-n material, or a combination thereof to provide optimal crosstalk suppression.

In embodiments of light barrier grid 124 including both metal and low-n material, spatially non-uniformity may be due to variation in, for example, height of the metal portion of the grid, width of the metal portion of the grid, width of the low-n material portion of the grid, ratio between amounts of metal and low-n material, or a combination of one or more of these parameters.

In one implementation of light barrier grid 124 with metal and low-n material, the ratio of low-n material to metal decreases with distance away from center 126. This implementation places more low-n material near center 126 where the incidence angle onto light barrier grid 124 from adjacent color filters 122 is relatively large (see incidence angle 154 of chief ray 150, for example) to take advantage of total internal reflection at the interface between color filters 122 and light barrier grid 124. At more peripheral locations, the incidence angles are likely to be less than the critical angle for total internal reflection at an interface between color filter 122 and a low-n material portion of light barrier grid 124 (see incidence angle 164 of chief ray 160, for example). Hence, at these more peripheral locations, low-n material is likely a less effective light barrier. Therefore, this implementation of light barrier grid 124 includes less or no low-n material at the more peripheral locations, as compared to locations near center 126.

While FIG. 1 shows three different regions of light-barrier grid 124 (a central region near center 126, a most peripheral region, and a region in between the central and most peripheral regions), light barrier grid 124 may be configured with two or more than three distinct regions each having a different composition tailored for the associated angles of incidence, without departing from the scope hereof. Also, without departing from the scope hereof, light-barrier grid 124 may exhibit a substantially continuous variation in composition as a function of the distance away from center 126. Herein, a "continuous" variation or change refers to a gradual, grid element-by-grid element variation or change, for example from center 126 to a peripheral region of light-barrier grid 124, wherein a grid element is a portion of the light-barrier grid located between two adjacent color filters such as color filters 122.

The array of color filters 122 is depicted in FIG. 1 as being composed of red (R), green (G), and blue (B) color filters transmitting light in the red, green, and blue spectral ranges, respectively. In the exemplary illustration of FIG. 1, these R, G, and B type color filters 122 are arranged in a repetitive RGB pattern in each pixel row of image sensor 100 (FIG. 1 shows one row of pixels). Without departing from the scope hereof, color filter layer 120 may arrange R, G, and B type color filters according to a different pattern, such as the Bayer pattern or another pattern known in the art. Furthermore, color filter layer 120 may be configured with different types of color filters 122, for example (a) cyan, magenta, and yellow, (b) cyan, magenta, yellow, and green, (c) red, green, blue, and white, or (d) red, green, blue, and infrared, without departing from the scope hereof.

FIG. 1 shows light barrier grid 124 as having rectangular cross section in the plane of FIG. 1. Without departing from the scope hereof, light barrier grid 124 may have a differently shaped cross section, for example trapezoidal, triangular, or other polygonal and/or curved shapes.

Figure 2:
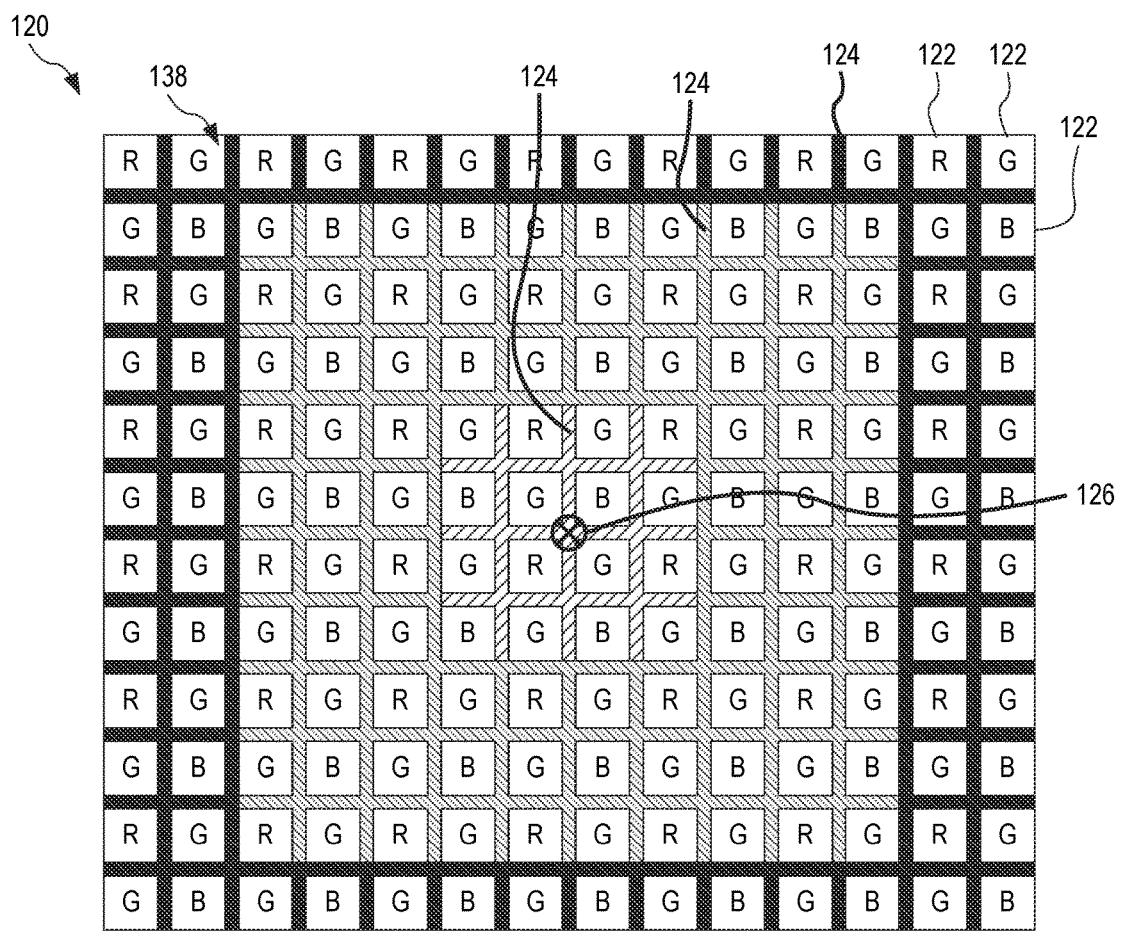
FIG. 2 shows a color filter layer of the image sensor of FIG. 1 in top plan view, according to an embodiment.

FIG. 2 shows color filter layer 120 in top plan view onto light-receiving surface 138. Color filter layer 120 arranges the array of color filters 122 as a two-dimensional array, wherein adjacent color filters 122 are separated from each other by a portion of light barrier grid 124. For clarity of illustration, not all color filters 122 are labeled in FIG. 2.

Although, FIG. 2 shows light barrier grid 124 as having three distinct regions, light barrier grid 124 may be configured differently, as discussed above in reference to FIG. 1. Likewise, the array of color filters 122 may be configured differently, as discussed above in reference to FIG. 1. Without departing from the scope hereof, light barrier grid 124 may exist also around the periphery of the most peripheral color filters 122, such that each color filter 122, as viewed in the top plan view of FIG. 2, is surrounded by light barrier grid 124.

Without departing from the scope hereof, image sensor 100 may include a different number of photodiodes 112 and respective corresponding color filters 122 than shown in FIGS. 1 and 2. For example, image sensor 100 may include thousands or millions of photodiodes 112 and respective corresponding color filters 122. Also without departing from the scope hereof, light barrier grid 124 need not extend all the way from light-receiving surface 118 to light-receiving surface 138. In one example, light barrier grid 124 extends from light-receiving surface 118 partway into color filter layer 120 but not all the way to light-receiving surface 138.

Figure 3:
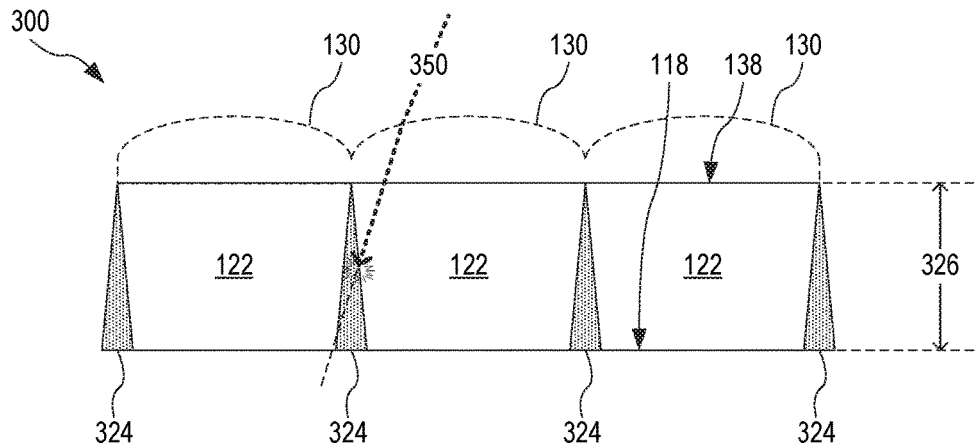
FIG. 3 illustrates a portion of a color filter layer with a metal light barrier grid that, in the portion shown in FIG. 3, is substantially composed of metal, according to an embodiment.

FIG. 3 illustrates a portion of one exemplary color filter layer 300 with a metal light barrier grid 324 that, in the portion shown in FIG. 3, is substantially composed of metal. Color filter layer 300 is an embodiment of color filter layer 120 and may represent a portion of color filter layer 120 near center 126 or at a greater distance from center 126. Metal light barrier grid 324 is an embodiment of light barrier grid 124. Metal light barrier grid 324 may include tungsten, copper, aluminum, and/or an alloy thereof. FIG. 3 shows color filter layer 300 in the same view as used in FIG. 1. FIG. 3 also shows optional microlenses 130.

Light 350 incident on one color filter 122 of color filter layer 300 in a direction propagating toward an adjacent color filter 122 is at least partly absorbed by the metal of metal light barrier grid 324. Hence, light 350 does not reach the adjacent color filter 122. However, at least a portion of light 350 is absorbed by metal light barrier grid 324 and therefore escapes detection by the photodiode 112 underlying the color filter 122 upon which light 350 is incident at light-receiving surface 138. Metal light barrier grid 324 extends from light-receiving surface 118 to light-receiving surface 138, and thus spans the full height 326 of color filter layer 300.

Optionally, light 350 is refracted by microlens 130 (as shown in FIG. 3) and/or at light-receiving surface 138. FIG. 3 shows metal light barrier grid 324 as having triangular cross section in the plane of FIG. 3. Without departing from the scope hereof, metal light barrier grid 324 may have a differently shaped cross section, for example rectangular, trapezoidal, triangular, or other polygonal and/or curved shapes.

Figure 4:
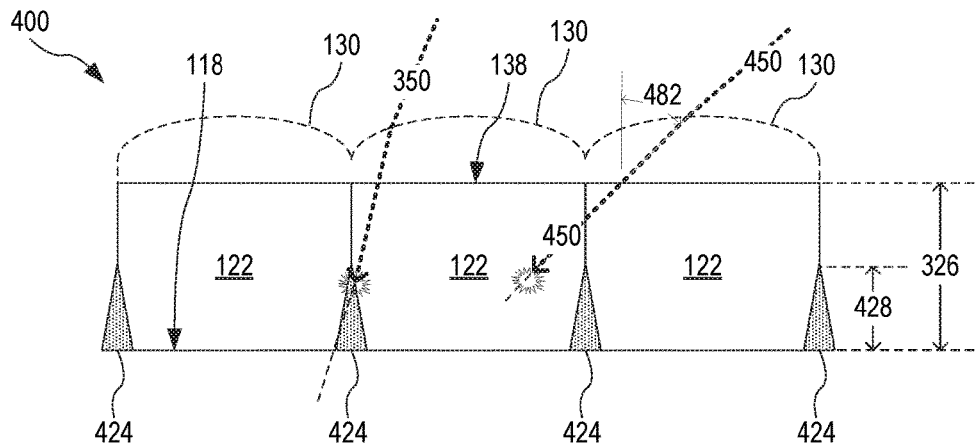
FIG. 4 illustrates a portion of a color filter layer with a metal light barrier grid that, in the portion shown in FIG. 4, is substantially composed of metal but does not span the full height of the color filter layer, according to an embodiment.

FIG. 4 illustrates a portion of one exemplary color filter layer 400 with a metal light barrier grid 424 that, in the portion shown in FIG. 4, is substantially composed of metal but does not span the full height 326 of color filter layer 400. Color filter layer 400 is an embodiment of color filter layer 120 and is similar to color filter layer 300 apart from metal light-barrier grid 424 extending only partway into color filter layer 400 from light-receiving surface 118. Metal light barrier grid 424 is an embodiment of light barrier grid 124, which is similar to metal light barrier grid 324 apart from having height 428 that is less than height 326. Color filter layer 400 may represent a portion of color filter layer 120 near center 126 or at a greater distance from center 126. FIG. 4 shows color filter layer 400 in the same view as used for color filter layer 300 in FIG. 3.

As compared to metal light barrier grid 324, the reduced height 428 of metal light barrier grid 424 allows for transmission of some light between adjacent color filters 122. Light 350 is incident on metal light-barrier grid 424, and at least a portion of light 350 is absorbed thereby. Other exemplary light 450 is incident on one color filter 122 and propagates to an adjacent color filter 122 above light barrier grid 424. Such transmission may introduce more crosstalk than exhibited by color filter layer 300. However, the light loss in color filter layer 400 attributed to light absorption by metal light barrier grid 424 is generally less than the light loss in color filter layer 300 attributed to light absorption by metal light barrier grid 324.

For illustrative purposes, light 350 may be considered an example of light incident on color filter layer 400 (or, more generally, color filter layer 120) near center 126, while light 450 may be considered an example of light incident on color filter layer 400 (or color filter layer 120) at a greater distance from center 126, such as near the periphery of color filter layer 400 (or color filter layer 120).

In certain embodiments, any two adjacent color filters 122 of color filter layer 400 are configured to transmit light in wavelength ranges that are substantially non-overlapping. In such embodiments, a first color filter 122, on which light 450 is incident at light-receiving surface 138, at least attenuates any spectral components of light 450 that are outside the transmission band of this first color filter 122. Herein, a "transmission band" refers to the range of wavelength, for which the material under consideration is at least partly transmissive. Consequently, this first color filter 122 at least attenuates any spectral components of light 450 that are within the transmission band of the adjacent color filter 122. When light 450 subsequently propagates into the adjacent color filter 122, (a) any spectral components of light 450 that are within the transmission band of the adjacent color filter 122 are at least diminished upon entry into the adjacent color filter 122 and (b) any spectral components of light 450 that are within the transmission band of the first color filter 122, and thus relatively unattenuated upon entry into the adjacent color filter 122, are at least attenuated by the adjacent color filter 122. Accordingly, in this embodiment, color filters 122 inherently help suppress crosstalk. This inherent crosstalk suppression is particularly effective for light 450 incident on light-receiving surface at a large angle of incidence 482. At large angles of incidence 482, light 450 has a relatively long propagation distance through color filter layer 400 before reaching light receiving surface 118 of the underlying silicon layer, and therefore undergoes relatively effective spectral filtering by at least one of the first color filter 122 and the adjacent color filter 122, resulting in relatively effective crosstalk suppression by virtue of the mutually exclusive transmission bands of the first color filter 122 and the adjacent color filter 122. Generally, angle of incidence 482 is larger at more peripheral portions of color filter layer 120. Hence, crosstalk suppression by virtue of adjacent color filters 122 having mutually exclusive transmission bands is generally more effective near the periphery of color filter layer 120 than near center 126.

Although FIG. 4 shows metal light barrier grid 424 as having triangular cross section in the plane of FIG. 4, metal light barrier grid 424 may have a differently shaped cross section, for example trapezoidal, rectangular, or other polygonal and/or curved shapes, without departing from the scope hereof.

Figure 5:
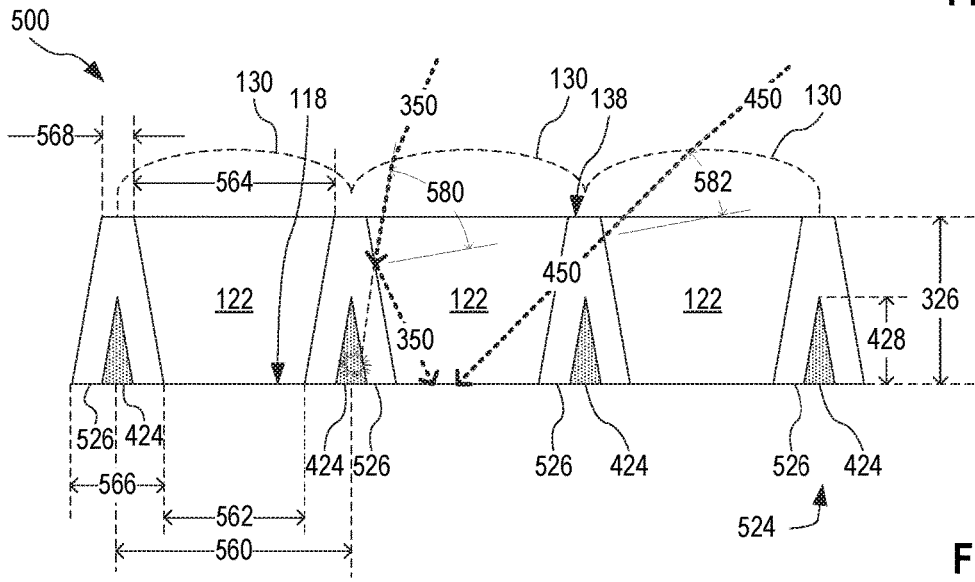
FIG. 5 illustrates a portion of a color filter layer with a light barrier grid that, in the portion shown in FIG. 5, includes both metal and low-n material, according to an embodiment.

FIG. 5 illustrates a portion of one exemplary color filter layer 500 with a light barrier grid 524 that, in the portion shown in FIG. 5, includes both metal and low-n material. Color filter layer 500 is an embodiment of color filter layer 120, and light barrier grid 524 is an embodiment of light barrier grid 124. Light barrier grid 524 is an extension of light barrier grid 424. In the portion shown in FIG. 5, light barrier grid 524 includes metal light barrier grid 424 and low-n material 526 covering metal light barrier grid 424. Low-n material 526 is, for example, silicon dioxide, or a polymer (such as polystyrene, polyethylene, polyethylene terephthalate, polyurethane, polycarbonate, polymethyl methacrylate, a fluorinated organic polymer, photoresist, or a combination thereof), or a combination of silicon dioxide and a polymer. Low-n material 526 may include a dopant, e.g., a pigment or dye, to produce a low index of refraction. Color filter layer 500 may represent a portion of color filter layer 120 near center 126 or at a greater distance from center 126. FIG. 5 shows color filter layer 500 in the same view as used for color filter layer 300 in FIG. 3.

Low-n material 526 serves to reduce light loss caused by light absorption in metal light barrier grid 424. Light 350 is incident on the interface between a color filter 122 and low-n material 526 at an angle 580 that is greater than the critical angle for total internal reflection. Thus, light 350 is reflected by low-n material 526 and continues propagation through the same color filter 122 to light-receiving surface 118, such that low-n material 526 both (a) prevents crosstalk associated with light 350 and (b) facilitates loss-free detection of light 350 by the photodiode 112 associated with the color filter 122 on which light 350 is incident at light-receiving surface 138. For comparison, in the absence of low-n material 526, at least a portion of light 350 would be absorbed by metal light barrier grid 424 and escape detection.

Light 450 is incident on the interface between a color filter 122 and low-n material 526 at an angle 582, which is less than the critical angle for total internal reflection. At least a portion of light 450 is therefore coupled into low-n material 526. Furthermore, the propagation direction of light 450 is such that light 450 passes through low-n material above metal light barrier grid 424 and into the adjacent color filter 122, thus potentially causing crosstalk. In embodiments where adjacent color filters 122 have mutually exclusive transmission bands, crosstalk may be suppressed. However, the presence of low-n material 526 reduces the path lengths of light 450 within color filters 122. Therefore, low-n material is less suitable for a situation where incoming light is at a shallow angle, i.e., at a large angle of incidence (such as at the peripheral location of a pixel array).

As discussed above in reference to FIG. 3, for illustrative purposes, light 350 may be considered an example of light incident on color filter layer 500 near center 126, while light 450 may be considered an example of light incident on color filter layer 500 at a greater distance from center 126, such as near the periphery of color filter layer 500.

The propagation of light 350 and 450 in FIG. 5 illustrates that the crosstalk-suppression of low-n material 526 is more effective at portions of color filter layer 500 (or color filter layer 120) that are near center 126, where the angles of incidence onto light-receiving surface 138 are generally smaller.

FIG. 5 shows metal light barrier grid 424 and low-n material 526 as having, respectively, triangular and trapezoidal cross section in the plane of FIG. 5. Without departing from the scope hereof, color filter layer 500 may implement a metal light barrier grid 424 and/or low-n material 526 of a differently shaped cross section. In FIG. 5, low-n material 526 spans the full height 326 of color filter layer 500. However, low-n material 526 may extend from light-receiving surface 118 toward light-receiving surface 138 but only to a non-zero distance away from light-receiving surface 138, without departing from the scope hereof.

Both metal light barrier grid 424 and low-n material 526 occupy space that therefore cannot be occupied by color filters 122. The portions of color filter layer 500 occupied by metal light barrier grid 424 or low-n material 526, do not provide color filtering. At light-receiving surface 138, low-n material 526, between two adjacent color filters 122, has width 568, and each color filter 122 has width 564. At light-receiving surface 118, low-n material 526, between two adjacent color filters 122, has width 566, while each color filter 122 has width 562. In the absence of metal light barrier grid 424 and low-n material 526, each color filter 122 would have width 560 throughout the full height of color filter layer 500. Each of widths 562 and 564 is less than the width 560 that color filter 122 would have had in the absence of metal light barrier grid 424 and low-n material 526. The center-to-center spacing of adjacent color filters 122 equals width 560 and is typically defined by the center-to-center spacing of the corresponding photodiodes 112 of silicon layer 110. Therefore, typically, the sum of widths 568 and 564, as well as the sum of widths 566 and 562, is a fixed quantity for any given silicon layer 110, while the ratio of width 568 to width 564, as well as the ratio of width 566 to width 562, may be tuned to trade off crosstalk suppression and color filtering. In one example, width 566 is in the range from 5% to 20% of width 560, while width 562 correspondingly is in the range from 95% to 80% of width 560.

Referring again to FIG. 1, different portions of color filter layer 120 may implement different respective ones of color filter layers 300, 400, and 500, or similar embodiments, to account for the gradient in incidence angle of light onto light-receiving surface 138 and achieve effective and/or optimal crosstalk suppression across the full color filter layer 120.

Figure 6A:
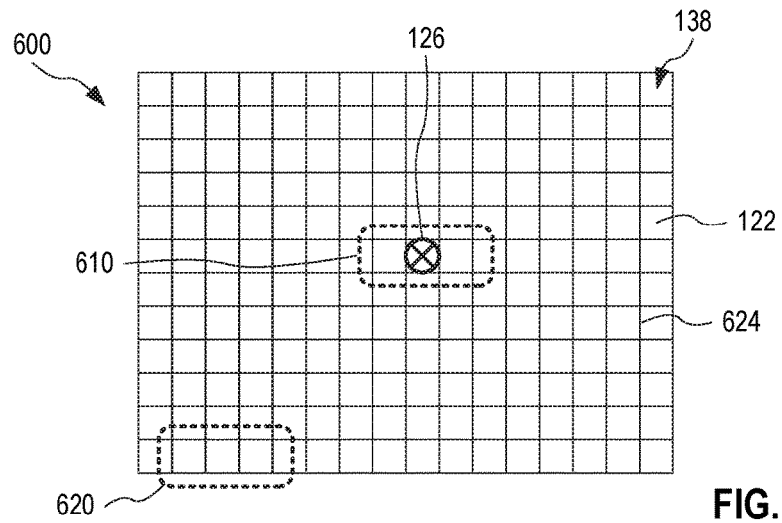
FIGS. 6A-C illustrate a crosstalk-suppressing color filter layer that includes a light barrier grid with a spatially non-uniform composition of metal and low-n material, according to an embodiment.
Figure 6B:
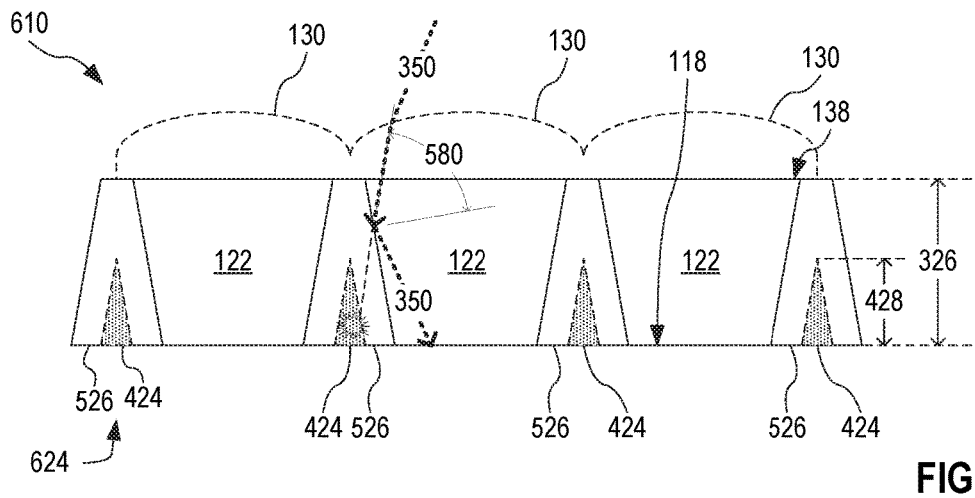
Figure 6C:
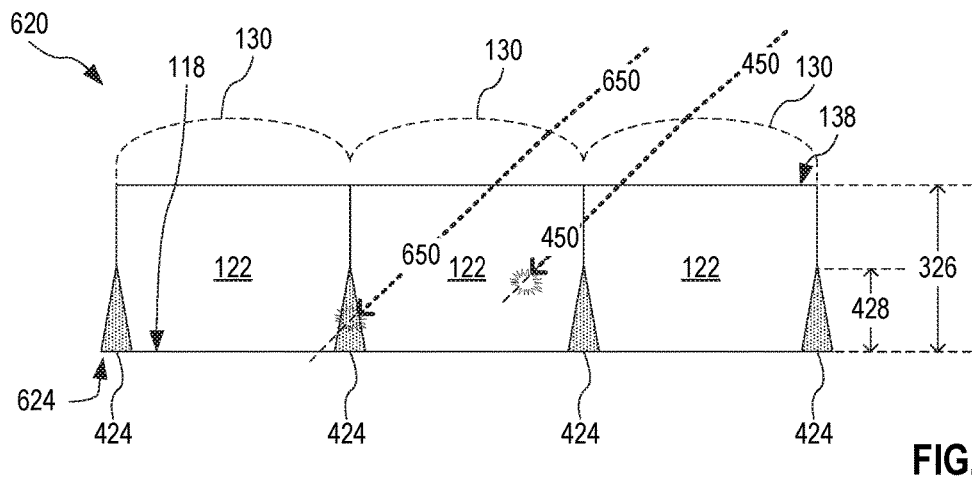

FIGS. 6A-C illustrate one exemplary crosstalk-suppressing color filter layer 600 that includes a light barrier grid 624 with a spatially non-uniform composition of metal and low-n material. Color filter layer 600 is an embodiment of color filter layer 120, and light barrier grid 624 is an embodiment of light barrier grid 124. FIG. 6A is a top plan view of light-receiving surface 138 of color filter layer 600. FIG. 6B is a cross sectional view of a portion 610 of color filter layer 600 (and optional microlenses 130) at center 126 of color filter layer 600. FIG. 6C is a cross sectional view of a portion 620 of color filter layer 600 (and optional microlenses 130) at a peripheral location of color filter layer 600. The view used in each of FIGS. 6B and 6C is the same as used in FIG. 3. FIGS. 6A-C are best viewed together. Portion 610 includes low-n material to best handle light incident on light-receiving surface 138 at relatively small angles of incidence. Portion 620 does not have a low-n material layer, so as to best handle light incident on light-receiving surface 138 at relatively large angles of incidence.

Portion 610 is similar to color filter layer 500 except that light barrier grid 624, within portion 610, need not include metal light barrier grid 424. Since portion 610 is located at center 126, light is generally incident on light-receiving surface 138 at a relatively small angle of incidence, for example as indicated by light 350 in FIG. 6B. As discussed above in reference to FIG. 5, light 350 tends to be internally reflected by low-n material 526, to stay within color filter 122. Thus, at center 126, low-n material 526 serves to suppress crosstalk through a loss-free mechanism.

Portion 620 is similar to color filter layer 400. Since portion 620 is located at near the periphery of color filter layer 600, light is generally incident on light-receiving surface 138 at a relatively large angle of incidence, for example as indicated by light 450 and light 650 in FIG. 6C. As discussed above in reference to FIG. 5, low-n material 526 tends to provide less effective crosstalk suppression for light 450. Therefore, portion 620 may be optionally designed to omit low-n material 526. Instead, crosstalk suppression within portion 620 is provided by metal light barrier grid 424. Light 650 is incident on light-receiving surface 138 at a first color filter 122, at the same angle as light 450, and propagates toward an adjacent color filter 122. However, metal light barrier grid 424 blocks light 650 from reaching the adjacent color filter 122, thus suppressing crosstalk. Light 450 passes the interface between (a) a first color filter 122, upon which light 450 is incident at light-receiving surface 138, and (b) an adjacent color filter 122. However, in embodiments, wherein adjacent color filters 122 have mutually exclusive transmission bands, light 450 is at least attenuated, and possibly fully extinguished, before reaching light-receiving surface 118.

Portions of color filter layer 600 located between center 126 and the periphery of color filter layer 600 may undergo a stepwise or gradual transition between the compositions of light barrier grid 624 in portion 610 and light barrier grid 624 in portion 620. In one example, the amount of low-n material 526 gradually decreases from the amount shown in FIG. 6B to no low-n material 526, as shown in FIG. 6C. In another example, portion 610 spans a central region including all color filters 122 within a certain distance from center 126, and portion 620 spans the remaining portion of color filter layer 600.

Within portion 610, when including metal light barrier grid 624, metal light barrier grid 624 may absorb at least a portion of light incident on low-n material 526 at angles less than the critical angle for total internal reflection.

FIGS. 6B and 6C show metal light barrier grid 424 and low-n material 526 as having, respectively, triangular and trapezoidal cross section in the plane of FIGS. 6B and 6C. Without departing from the scope hereof, color filter layer 600 may implement a metal light barrier grid 424 and/or low-n material 526 of a differently shaped cross section.

FIGS. 7A-G illustrate one exemplary crosstalk-suppressing color filter layer 700 with a composite metal/low-n material light barrier grid 721 and color filters 722 of spatially non-uniform width to accommodate a spatially non-uniform amount of low-n material in light barrier grid 721. Color filter layer 700 is an embodiment of color filter layer 600. Light barrier grid 721 is an embodiment of light barrier grid 624, and color filter 722 is an embodiment of color filter 122. Light barrier grid 721 includes a metal light barrier grid 724 and a low-n material 726. Metal light barrier grid 724 is an embodiment of metal light barrier grid 424. Low-n material 726 is an embodiment of low-n material 526. Light barrier grid 721 is an embodiment of light barrier grid 624. Light barrier grid 721 includes more low-n material near center 126 of color filter layer 700 and more metal near the periphery of color filter layer 700, so as to account for the gradient in chief ray angle from center 126 to the periphery.

Figure 7A:
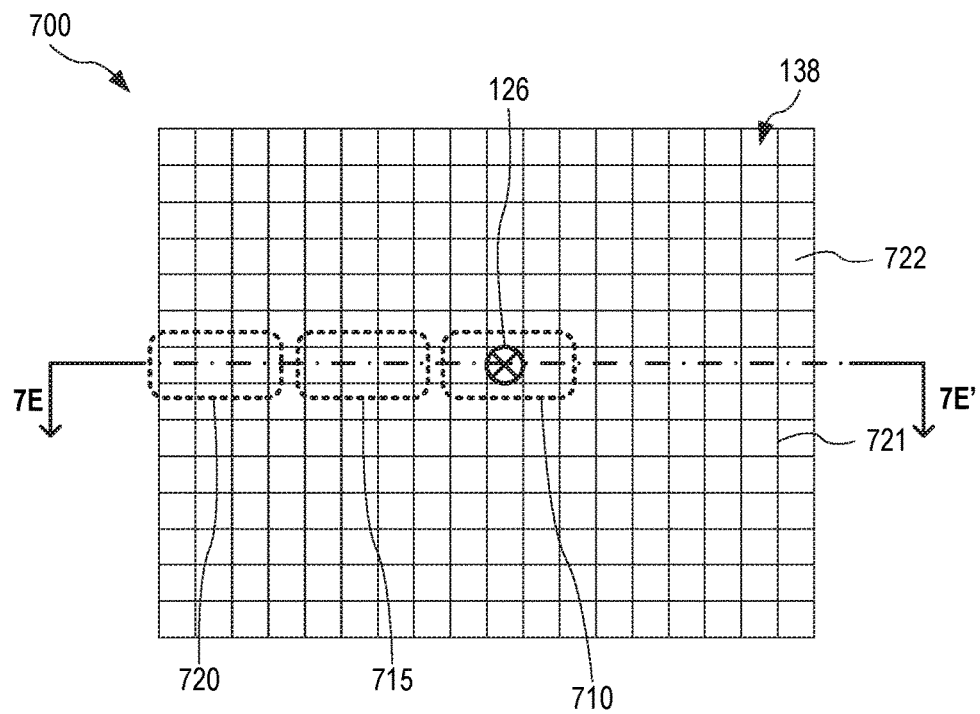
FIGS. 7A-G illustrate a crosstalk-suppressing color filter layer with a composite metal/low-n material light barrier grid and color filters of spatially non-uniform width to accommodate a spatially non-uniform amount of low-n material in the composite light barrier grid, according to an embodiment.
Figure 7B:
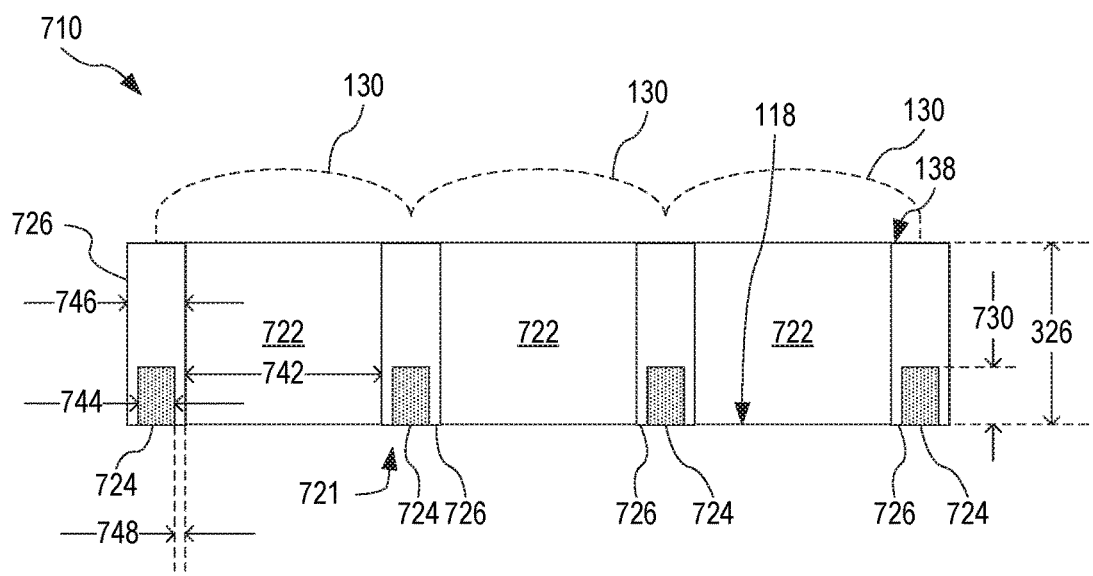
Figure 7C:
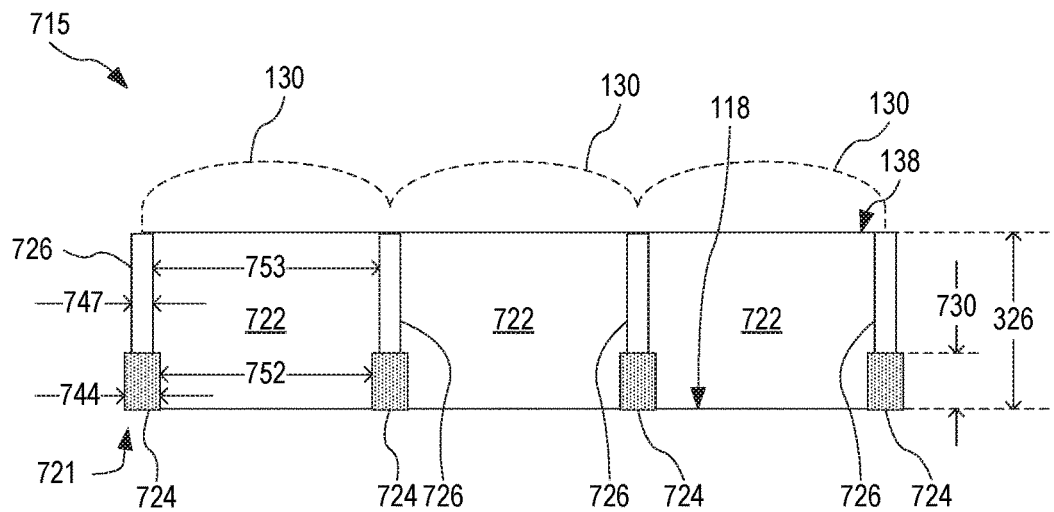
Figure 7D:
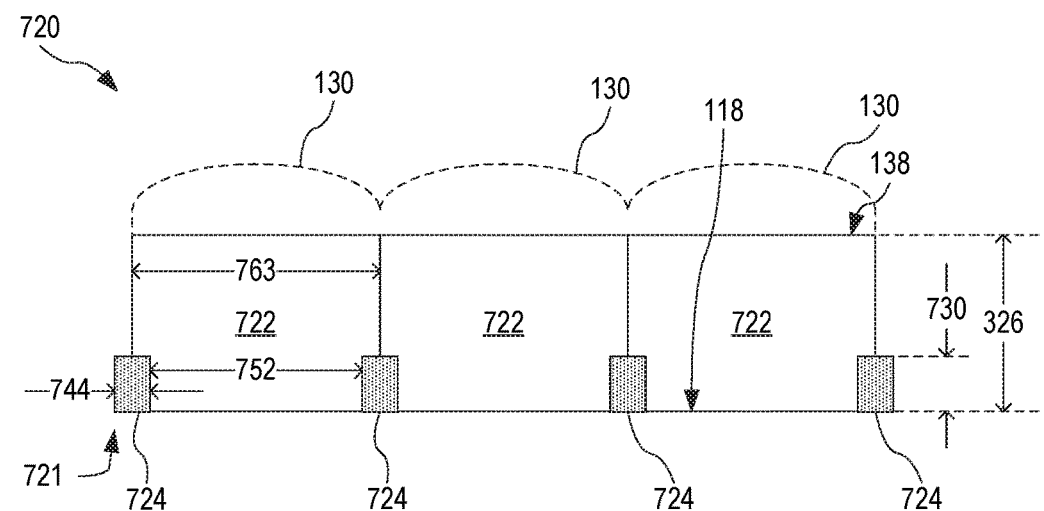
Figure 7E:
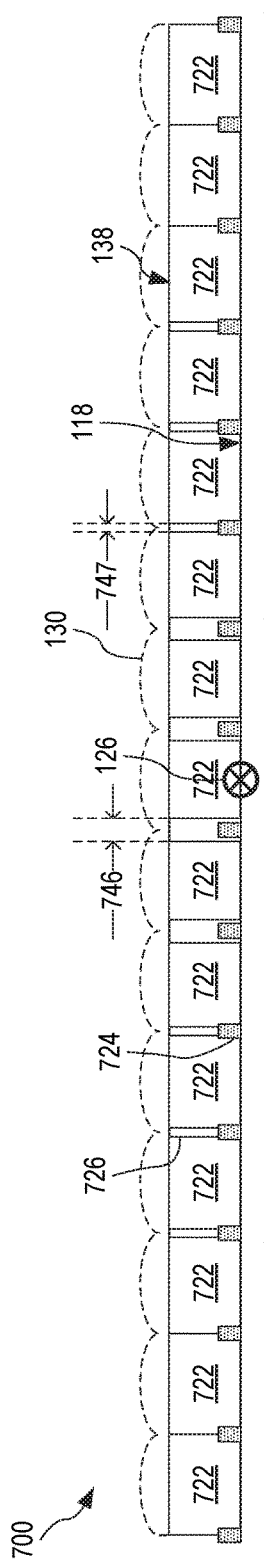
Figure 7F:
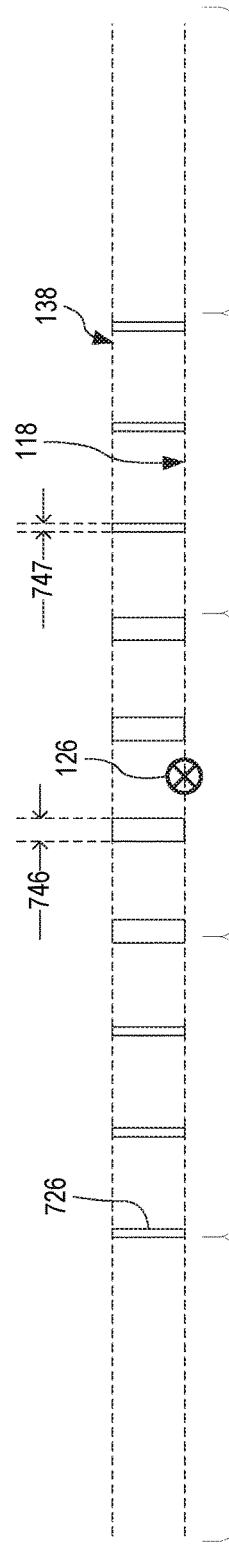
Figure 7G:
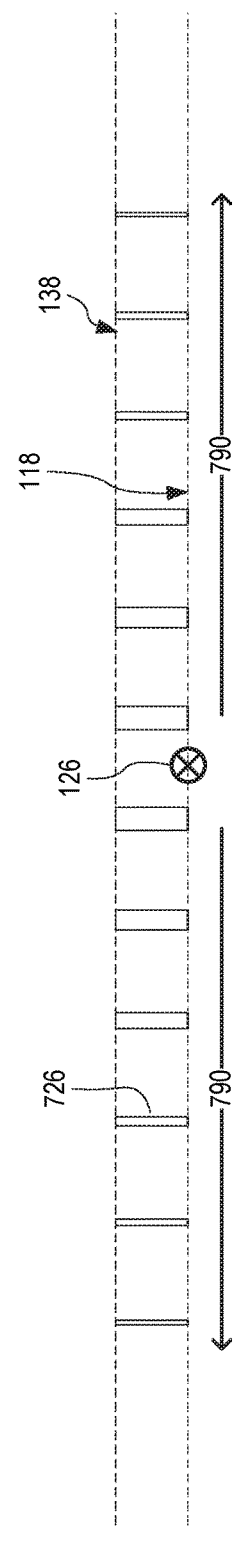

FIG. 7A is a top plan view of light-receiving surface 138 of color filter layer 700. FIG. 7B is a cross sectional view of a portion 710 of color filter layer 700 (and optional microlenses 130) at center 126 of color filter layer 700. FIG. 7C is a cross sectional view of a portion 715 of color filter layer 700 (and optional microlenses 130) at an intermediate location that is between center 126 and the periphery of color filter layer 700. FIG. 7D is a cross sectional view of a portion 720 of color filter layer 700 (and optional microlenses 130) at a peripheral location of color filter layer 700. The view used in each of FIGS. 7B-D is the same as used in FIG. 3. FIGS. 7E-G further illustrate the spatially non-uniform profile of the light barrier grid as described above. FIG. 7E is a cross sectional view of color filter layer 700 (and optional microlenses 130) along line 7E-7E' and through portions 710, 715, and 720. FIGS. 7F and 7G are cross sectional views of low-n material 726 of two respective embodiments of color filter layer 700 exhibiting a stepwise gradient and substantially continuous gradient, respectively, in the width of low-n material 726. FIGS. 7F and 7G show low-n material 726 in the same view as used in FIG. 7E. FIG. 7A-G are best viewed together.

The configuration of metal light barrier grid 724 is substantially spatially uniform across color filter layer 700. Specifically, metal light barrier grid 724 is disposed on light-receiving surface 118 and has height 730 and width 744 in each of portions 710, 715, and 720. However, the width of color filters 722 increases with distance away from center 126.

Within portion 710, color filters 722 have width 742 throughout the full height 326 of color filter layer 700. Width 742 (see FIG. 7B) is less than the center-to-center spacing of adjacent color filters 722, leaving a gap of width 746 between each pair of adjacent color filters 722. Width 744 may be less than width 746, such that there is a gap of width 748 between metal light barrier grid 724 and color filters 722. However, without departing from the scope hereof, width 748 may be zero, such that there is no gap between metal light barrier grid 724 and color filters 722. The space between adjacent color filters 722, not occupied by metal light barrier grid 724, is occupied by low-n material 726. Hence, low-n material 726 flanks sides of color filters 722 facing an adjacent color filter 722, at least above height 730. Thus, at least at heights above heights 730, crosstalk suppression within portion 710 is similar to crosstalk suppression within portion 610 of color filter layer 600. At heights less than height 730, crosstalk suppression may be provided by metal light barrier grid 724 and, if present, low-n material 726.

Within portion 720, light barrier grid 721 does not include low-n material 726. Instead, color filters 722 have (a) width 763 at heights greater than height 730 and (b) width 752 at heights less than height 730. Width 763 equals the center-to-center spacing of color filters 722 such that, at heights greater than height 730, adjacent color filters 722 touch each other. At heights less than height 730, adjacent color filters 722 are separated from each other by metal light barrier grid 724. Crosstalk suppression within portion 720 is similar to crosstalk suppression within portion 620 of color filter layer 600.

Portion 715 represents a transition from portion 710 to portion 720. Within portion 715, color filters 722 have (a) width 752 at heights less than height 730 and (b) width 753 at heights greater than height 730. Thus, at heights less than height 730, adjacent color filters 722 are separated from each other by metal light barrier grid 724. At heights greater than height 730, adjacent color filters 722 are separated by each other by low-n material 726 of width 747. Width 747 is less than width 746. Within portion 715, crosstalk suppression is provided by low-n material 726 and metal light barrier grid 724 in combination.

It is understood that the transition from portion 710 to portion 720 may be gradual, for example continuous as shown in FIG. 7G or take place in two or more discrete steps, for example as shown in FIG. 7F. Portion 715 may be one stage of a gradual transition or one level of a stepwise transition, without departing from the scope hereof. In the embodiment of FIG. 7F, low-n material 726 has width 746 across the full extent of portion 710, width 747 across the full extent of portion 715 (on both sides of center 126), and is absent from portion 720 (on both sides of center 126). In the embodiment of FIG. 7G, the width of low-n material 726 between adjacent color filters 722 gradually decreases in directions 790 away from center 126 from a maximum width nearest center 126 to being absent at the periphery of color filter layer 700. Without departing from the scope hereof, portion 720 of the embodiment of FIG. 7F may include a small amount of low-n material 726, as is the case in portion 715 but with a smaller width between adjacent color filters 722. Likewise, the gradient in width of low-n material 726 between adjacent color filters 722 in the embodiment of FIG. 7G need not reach zero at or before the periphery of color filter layer 700, in which case some amount of low-n material 726 may be present between all adjacent color filters 722 of color filter layer 700.

In an embodiment, width 744 is in the range from 5% to 15% of width 763, and width 748 is substantially zero. In one example of this embodiment, width 763 is in the range from 1.0 to 1.55 microns, while width 748 is in the range from 0.1 to 0.15 microns. In an embodiment, height 730 is in the range from 10% to 60% of height 326. In one example of this embodiment, height 326 is in the range from 0.6 to 0.8 microns, and height 730 is in the range from 0.1 to 0.4 microns. These values for width 744, width 748, height 730, and height 326 represent a good tradeoff between (a) crosstalk suppression and (b) sensitivity and adequate color filtering.

FIGS. 7B-G show each of metal light barrier grid 724 and low-n material 726 as having rectangular cross section in the plane of FIGS. 7B-G. Without departing from the scope hereof, color filter layer 700 may implement a metal light barrier grid 724 and/or low-n material 726 of a differently shaped cross section, for example trapezoidal.

FIGS. 8A-G illustrate one exemplary crosstalk-suppressing color filter layer 800 with a stacked metal/low-n material light barrier grid 821, wherein the height of the metal portion is spatially non-uniform across light barrier grid 821. Color filter layer 800 is an embodiment of color filter layer 600. Light barrier grid 821 is an embodiment of light barrier grid 624. Light barrier grid 821 includes more low-n material near center 126 of color filter layer 800 and more metal near the periphery of color filter layer 800, so as to account for the gradient in chief ray angle from center 126 to the periphery. Color filter layer 800 includes a plurality of color filters 822. The dimensions of color filters 822 is substantially uniform across color filter layer 800. Color filter 822 is an embodiment of color filter 122. Light barrier grid 821 includes a metal light barrier grid 824 and a low-n material 826. Metal light barrier grid 824 is an embodiment of metal light barrier grid 424. Low-n material 826 is an embodiment of low-n material 526.

Figure 8A:
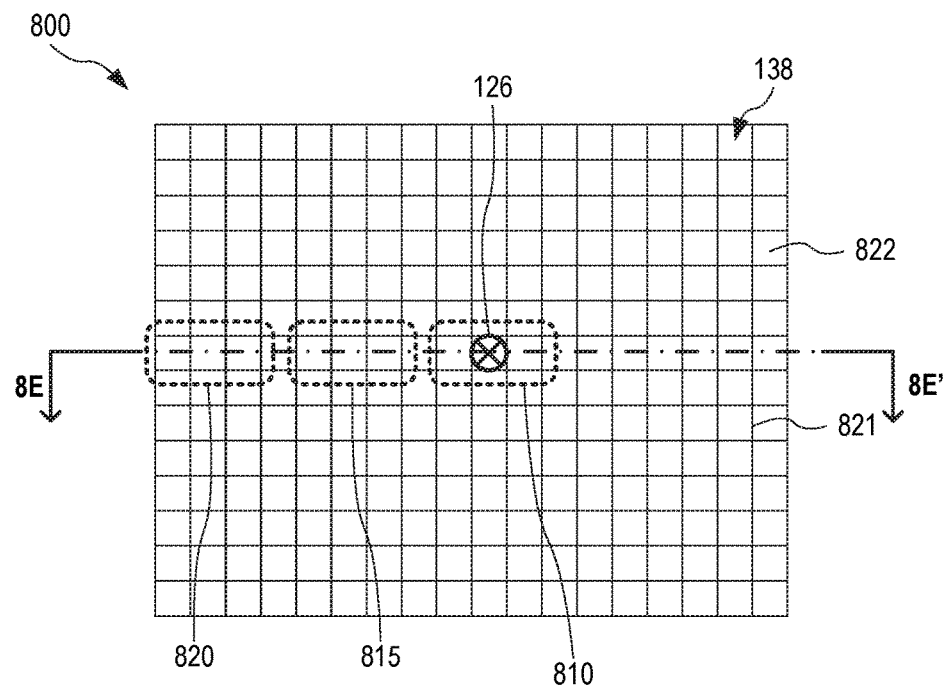
Figure 8B:
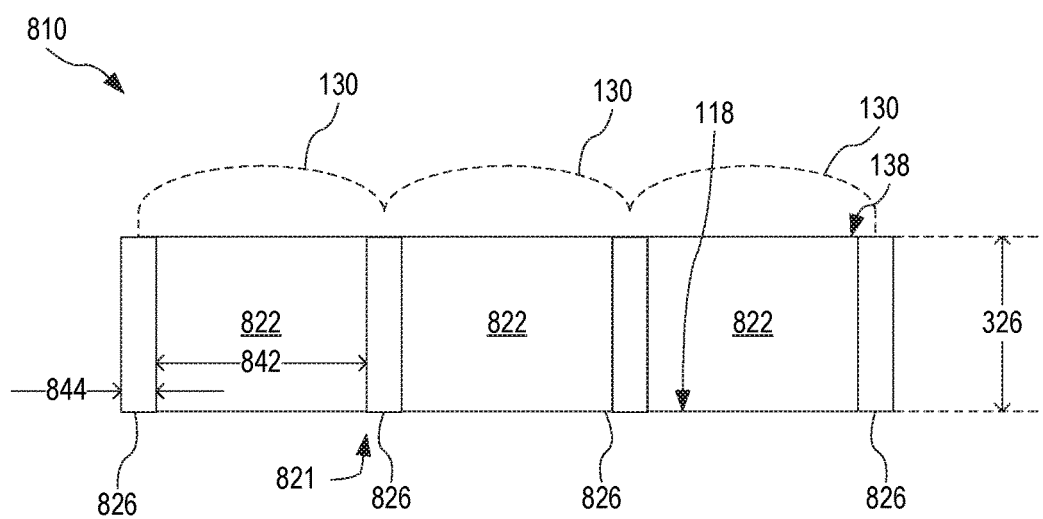
Figure 8C:
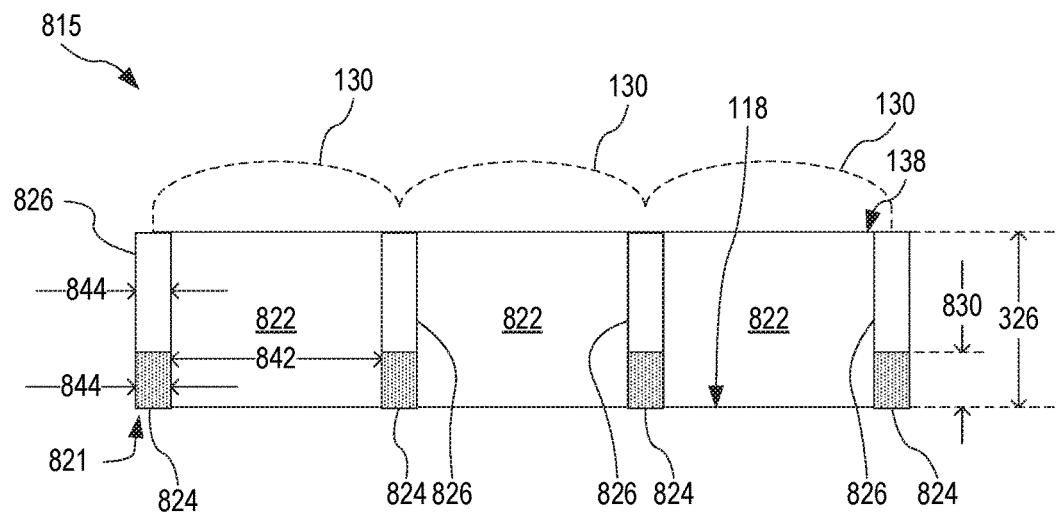
Figure 8D:
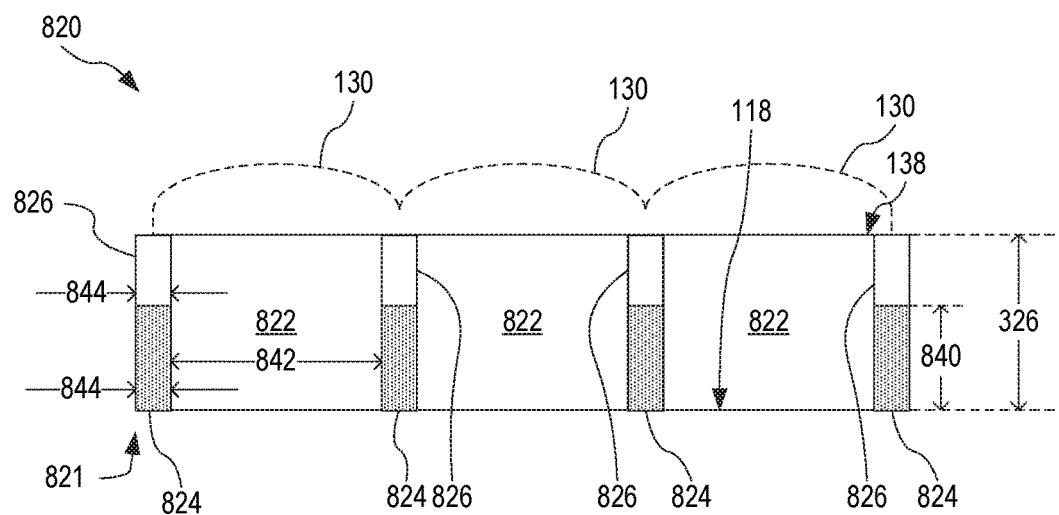

FIG. 8A is a top plan view of light-receiving surface 138 of color filter layer 800. FIG. 8B is a cross sectional view of a portion 810 of color filter layer 800 (and optional microlenses 130) at center 126 of color filter layer 800. FIG. 8C is a cross sectional view of a portion 815 of color filter layer 800 (and optional microlenses 130) at an intermediate location that is between center 126 and the periphery of color filter layer 800. FIG. 8D is a cross sectional view of a portion 820 of color filter layer 800 (and optional microlenses 130) at a peripheral location of color filter layer 800. The view used in each of FIGS. 8B-D is the same as in FIG. 3. FIG. 8E is a cross sectional view of color filter layer 800 (and optional microlenses 130) along line 8E-8E' and through portions 810, 815, and 820. FIGS. 8F and 8G are cross sectional views of metal light barrier grid 824 of two respective embodiments of color filter layer 800 exhibiting a stepwise gradient and substantially continuous gradient, respectively, in the height of metal light barrier grid 824. FIGS. 8F and 8G show metal light barrier grid 824 in the same view as used in FIG. 8E. FIGS. 8A-G are best viewed together.

The width 842 (see FIGS. 8B-D) of color filters 822 is substantially the same across color filter layer 800. Likewise, the width 844 (see FIGS. 8B-D) of light barrier grid 821, which spans the gap between adjacent color filters 822, is substantially the same across color filter layer 800. Light barrier grid 821 includes a bottom layer with metal light barrier grid 824 disposed on light-receiving surface 118. This bottom layer need not span the full extent of light-receiving surface 118. For example, portion 810 does not include metal light barrier grid 824. Light barrier grid 821 further includes a top layer furthest from light-receiving surface 118 and spanning from light-receiving surface 138 in the direction toward light-receiving surface 118 to either (a) metal light barrier grid 824, where present, or (b) light-receiving surface 118, in regions without metal light barrier grid 824. The height of metal light barrier grid 824 above light-receiving surface 118 increases with distance away from center 126.

Within portion 820, metal light barrier grid 824 has height 840. Height 840 may be less than the full height 326 of color filter layer 800 (as shown in FIG. 8D) or, without departing from the scope hereof, the same as full height 326. Within portion 815, metal light barrier grid 824 has height 830 which is less than height 840, such that portion 815 has more low-n material 826 than portion 820. Within portion 810, metal light barrier grid has height zero, that is, light barrier grid 821 does not include metal light barrier grid 824 in portion 810. Thus, in portion 810, light barrier grid 821 provides crosstalk suppression by virtue of low-n material 826 alone, such that portion 810 does not cause light loss by absorption in metal light barrier grid 824.

In an embodiment, width 844 is in the range from 5% to 15% of the sum of widths 844 and 842. In one example of this embodiment, the sum of widths 842 and 844 is in the range from 1.0 to 1.55 microns, while width 844 is in the range from 0.1 to 0.15 microns. In one embodiment, height 840 is in the range from 10% to 60% of height 326, and height 830 is in the range from 30% to 70% of height 840. In another embodiment, height 840 is in the range from 20% to 30% of height 326, and height 830 is in the range from 40% to 60% of height 840. In one example of this embodiment, height 326 is in the range from 0.7 to 0.9 microns, and height 840 is in the range from 0.15 to 0.25 microns. These values for width 842, width 844, height 840, height 830, and height 326 represent a good tradeoff between (a) crosstalk suppression and (b) sensitivity and adequate color filtering.

It is understood that the transition from portion 810 to portion 820 may be gradual, for example continuous as shown in FIG. 8G, or take place in two or more discrete steps, for example as shown in FIG. 8F. Portion 815 may be one stage of a gradual transition or one level of a stepwise transition, without departing from the scope hereof. In the embodiment of FIG. 8F, metal light barrier grid 824 has (a) zero height across the full extent of portion 810, i.e., metal light barrier grid 824 is absent from portion 810, (b) has height 830 across the full extent of portion 815 (on both sides of center 126), and (c) has height 840 across the full extent of portion 820 (on both sides of center 126). In the embodiment of FIG. 8G, the height of metal light barrier grid 824 gradually increases in directions 890 away from center 126 from zero nearest center 126 to a maximum height at the periphery of color filter layer 800. Without departing from the scope hereof, portion 810 of the embodiment of FIG. 8F may include a small amount of metal light barrier grid 824, as is the case in portion 815 but with a height that is less than height 830. Likewise, the gradient in height of metal light barrier grid 824 in the embodiment of FIG. 8G need not reach zero at center 126, in which case some amount of metal light barrier grid 824 may be present between all adjacent color filters 822 of color filter layer 800.

FIGS. 8B-G show each of metal light barrier grid 824 and low-n material 826 as having rectangular cross section in the plane of FIGS. 8B-G. Without departing from the scope hereof, color filter layer 800 may implement a metal light barrier grid 824 and/or low-n material 826 of a differently shaped cross section, for example trapezoidal.

FIGS. 9A-D illustrate another exemplary crosstalk-suppressing color filter layer 900 with a stacked metal/low-n material light barrier grid 921, wherein the height of the metal portion is spatially non-uniform across light barrier grid 921 and which further includes low-n material between the color filters and metal of light barrier grid 921. Color filter layer 900 is an embodiment of color filter layer 600 and an extension of color filter layer 800. Light barrier grid 921 is an embodiment of light barrier grid 624 and an extension of metal light barrier grid 824.

Figure 9A:
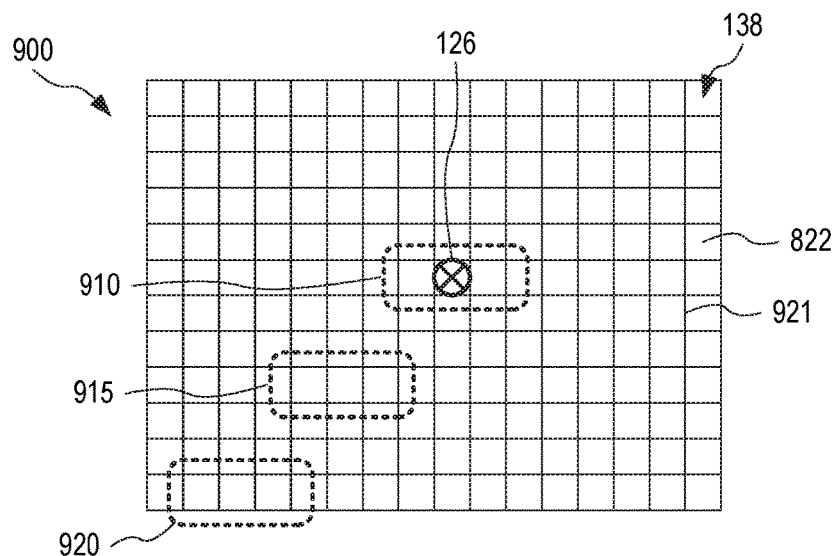
FIGS. 9A-D illustrate another crosstalk-suppressing color filter layer with a stacked metal/low-n material light barrier grid, wherein the height of the metal portion is spatially non-uniform across light barrier grid, according to an embodiment.
Figure 9B:
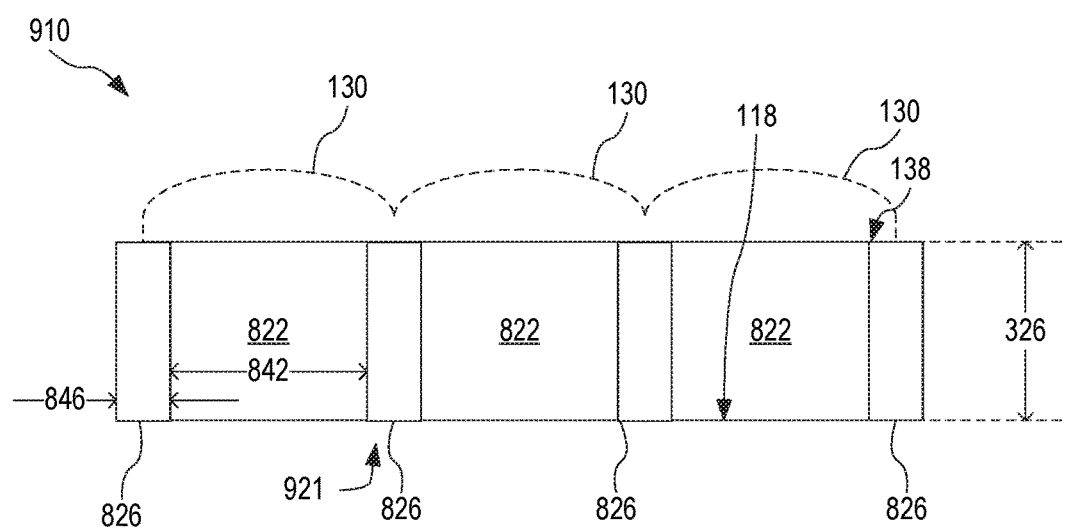
Figure 9C:
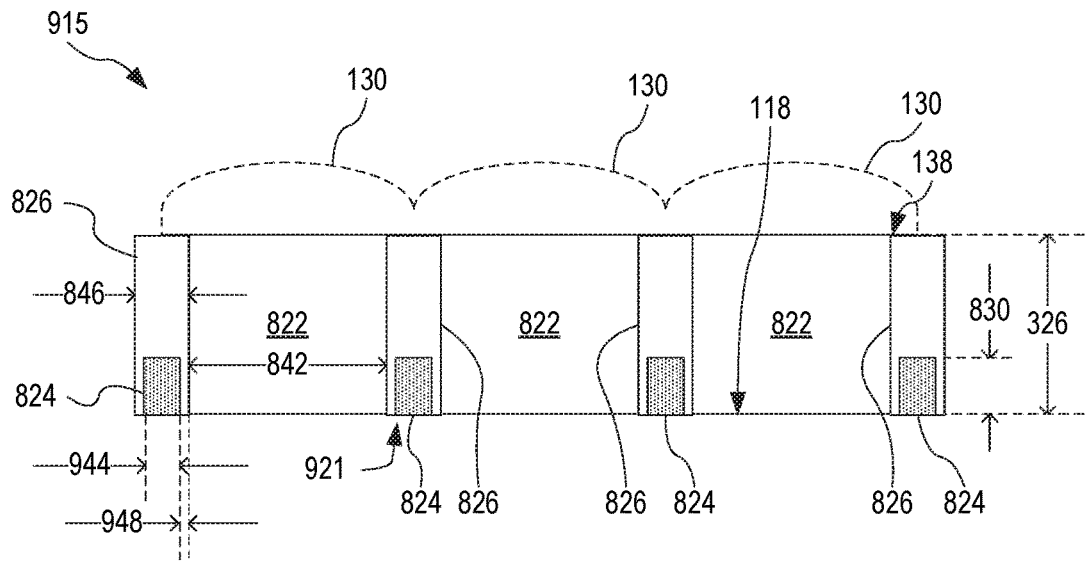
Figure 9D:
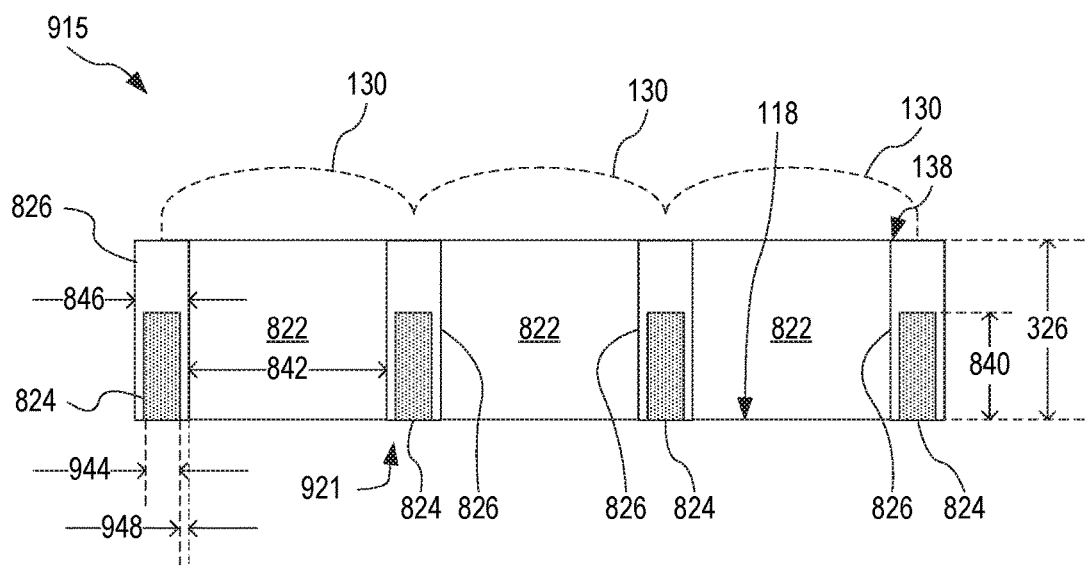

FIG. 9A is a top plan view of light-receiving surface 138 of color filter layer 900. FIG. 9B is a cross sectional view of a portion 910 of color filter layer 900 (and optional microlenses 130) at center 126 of color filter layer 900. FIG. 9C is a cross sectional view of a portion 915 of color filter layer 900 (and optional microlenses 130) at an intermediate location that is between center 126 and the periphery of color filter layer 900. FIG. 9D is a cross sectional view of a portion 920 of color filter layer 900 (and optional microlenses 130) at a peripheral location of color filter layer 900. The view used in each of FIGS. 9B-D is the same as used in FIG. 3. FIGS. 9A-D are best viewed together.

As is the case for light barrier grid 821, light barrier grid 921 includes more low-n material near center 126 of color filter layer 900 and more metal near the periphery of color filter layer 900, so as to account for the gradient in chief ray angle from center 126 to the periphery. Light barrier grid 921 includes metal light barrier grid 824 and low-n material 826. Color filter layer 900 is similar to color filter layer 800, except that light barrier grid 921 includes additional low-n material 826 at interfaces between metal light barrier grid 824 and color filters 822. This additional low-n material 826 may result from manufacturing tolerances leaving a gap between metal light barrier grid 824 and color filters 822.

In each of portions 910, 915, and 920 of color filter layer 900, metal light barrier grid 824 has width 948 which is insufficient to span width 846 of the gap between metal light barrier grid 824 and color filters 822. This gap is filled with additional low-n material 826.

Without departing from the scope hereof, an embodiment of color filter layer 120 may mix the properties of color filter layers 700, 800, and 900. In one such example, some color filters 822 are in direct contact with metal light barrier grid 824, while other color filters 822 have no contact with metal light barrier grid 824. In another example, both low n material 726 between color filters and metal light barrier 824 may simultaneously have spatially non-uniform characteristics (stepwise or gradual) as disclosed above. The embodiments disclosed in color filter layers 700, 800, and 900 may function as basic designs that can be combined to produce a more complex design.

FIG. 10 illustrates one exemplary method 1000 for manufacturing a backside-illuminated color image sensor with a crosstalk-suppressing color filter array. Method 1000 may be used to manufacture image sensor 100, for example implementing color filter layer 600.

In a step 1010, method 1000 forms an array of color filters and a metal grid on the light-receiving surface of a silicon substrate, including a corresponding array of photodiodes, to produce a color pixel array with partial crosstalk suppression. In one example of step 1010, an array of color filters 122 and metal light barrier grid 424 is formed on light-receiving surface 118, using methods known in the art. In this example, each color filter 122 is registered to a corresponding photodiode 112 of silicon layer 110, and forms a color pixel therewith.

In an embodiment, step 1010 includes steps 1012 and 1014. Step 1012 deposits metal on the light-receiving surface of the silicon layer to form the metal grid, and step 1014 deposits the array of color filters. In one example of this embodiment, step 1012 deposits metal layer grid 424 on light-receiving surface 118, and step 1014 deposits color filters 122 on light-receiving surface 118.

Without departing from the scope hereof, the order of steps 1012 and 1014 may be reversed.

In a step 1020, method 1000 deposits a dielectric material on the color pixel array, formed in step 1010, to integrally form (a) an array of microlenses for the color pixel array and (b) a light barrier filling spaces between the color filters not occupied by the metal grid. The index of refraction of the dielectric material is lower than the index of refraction of the color filters, such that the light barrier suppresses crosstalk through total internal reflection of light incident on the dielectric material from one of the color filters. In one example, step 1020 accepts, as an input workpiece, silicon layer 110 with color filters 122 and metal light barrier grid 424. In this example, step 1020 deposits low-n material 526 on the side of the input workpiece associated with light-receiving surface 118, color filters 122, and metal light barrier grid 424, to integrally form low-n material 526 and microlenses 130. Step 1020 may utilize methods known in the art.

In certain embodiments, method 1000 is performed at the wafer level to produce a wafer including a plurality of backside-illuminated color image sensors each having a spatially non-uniform crosstalk-suppressing color filter array.

FIG. 11 illustrates one exemplary crosstalk-suppressing color filter layer 1100 having low-n material 526 integrally formed with microlenses 130. Color filter layer 1100 together with integrally formed microlenses 130 forms an embodiment of color filter layer 600 combined with microlenses 130. Color filter layer 1100 may be manufactured using method 1000. As compared to color filter layer 600, as shown in FIGS. 6B and 6C, low-n material 526 of color filter layer 1100 is integrally formed with microlenses 130.

FIG. 12 illustrates one exemplary method 1200 for manufacturing a backside-illuminated color image sensor with a spatially non-uniform crosstalk-suppressing color filter array. Method 1200 may be used to manufacture image sensor 100, for example implementing color filter layer 700. Method 1200 is an embodiment of method 1000. Method 1200 includes steps 1210 and 1020. Step 1210 is an embodiment of step 1010.

Step 1210 includes step 1012 and a step 1214. Step 1214 is an embodiment of step 1014, wherein the array of color filters is deposited such that the width of the color filters increases with distance away from the center of the array of color filters. In one example, step 1214 forms color filters 722 on light-receiving surface 118.

Optionally, step 1214 includes one or both of steps 1216 and 1218. Step 1216 produces the array of color filters such that the spacing between adjacent color filters, at the center of the color filter array, is the same as the width of the metal grid. In one example of step 1216, color filters 722 at center 126 are deposited on light-receiving surface 118 such that width 748 is zero. Step 1218 produces the array of color filters such that the spacing between adjacent color filters is substantially zero at the most peripheral positions of the color filter array. In one example of step 1218, there is no gap between color filters 722 at center 126, as shown in FIG. 7D.

After performing step 1210, method 1200 performs step 1020, as discussed above in reference to FIG. 10. In one example of step 1020 implemented in method 1200, step 1020 integrally forms low-n material 726 of color filter layer 700 and microlenses 130.

Figure 13A:
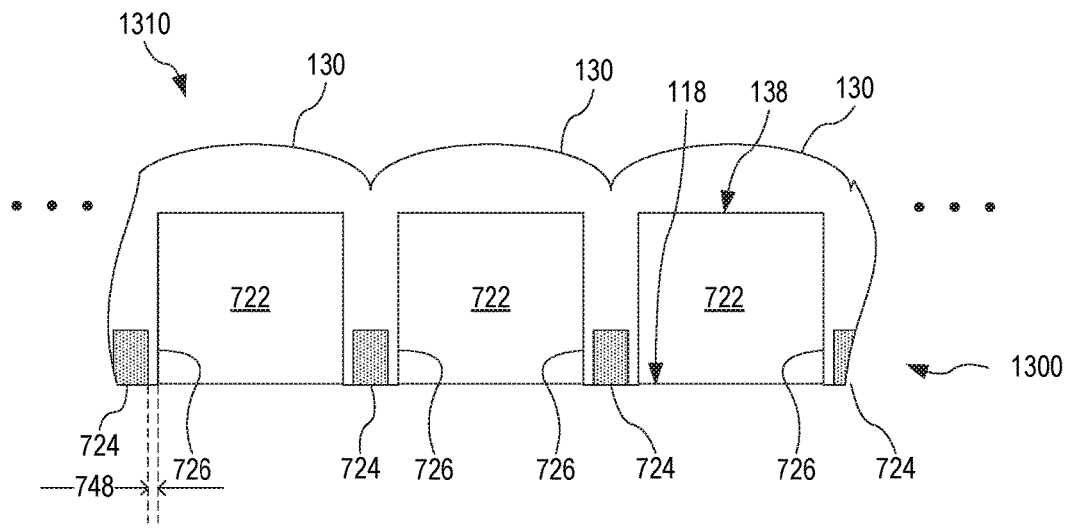
FIGS. 13A and 13B illustrate a crosstalk-suppressing color filter layer having (a) color filters of spatially non-uniform width and (b) low-n material integrally formed with microlenses, according to an embodiment.
Figure 13B:
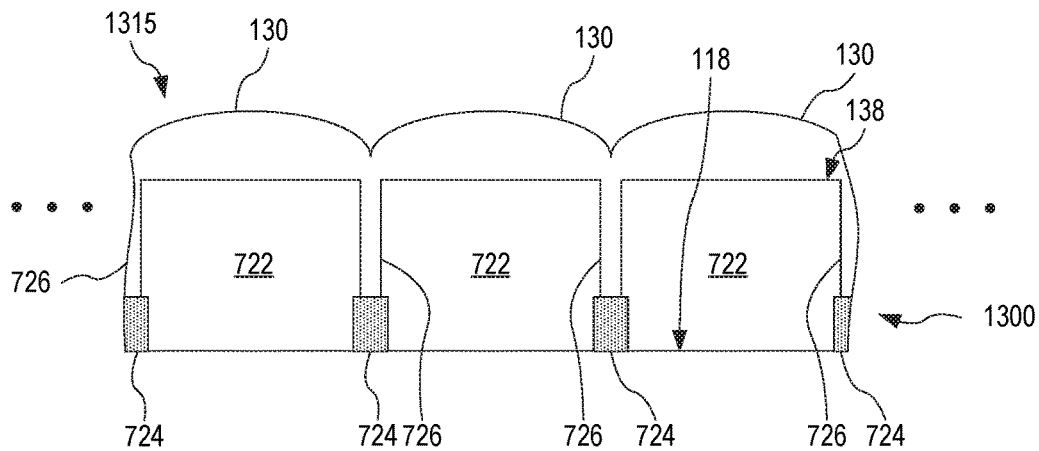

FIGS. 13A and 13B illustrate one exemplary crosstalk-suppressing color filter layer 1300 having (a) color filters 722 of spatially non-uniform width and (b) low-n material 726 integrally formed with microlenses 130. Color filter layer 1300 together with integrally formed microlenses 130 forms an embodiment of color filter layer 700 combined with microlenses 130, and may be manufactured using method 1200. FIG. 13A shows a portion 1310 of color filter layer 1300 with integrally formed microlenses 130, which is at center 126, corresponding to portion 710 of color filter layer 700. FIG. 13B shows a portion 1315 of color filter layer 1300 with integrally formed microlenses 130, which is between center 126 and the periphery of color filter layer 1300, corresponding to portion 715 of color filter layer 700.

As compared to color filter layer 700, as shown in FIGS. 7B-G, low-n material 726 of color filter layer 1300 is integrally formed with microlenses 130. When implementing step 1216 in the manufacturing of color filter layer 1300, width 748 is zero.

Figure 14:
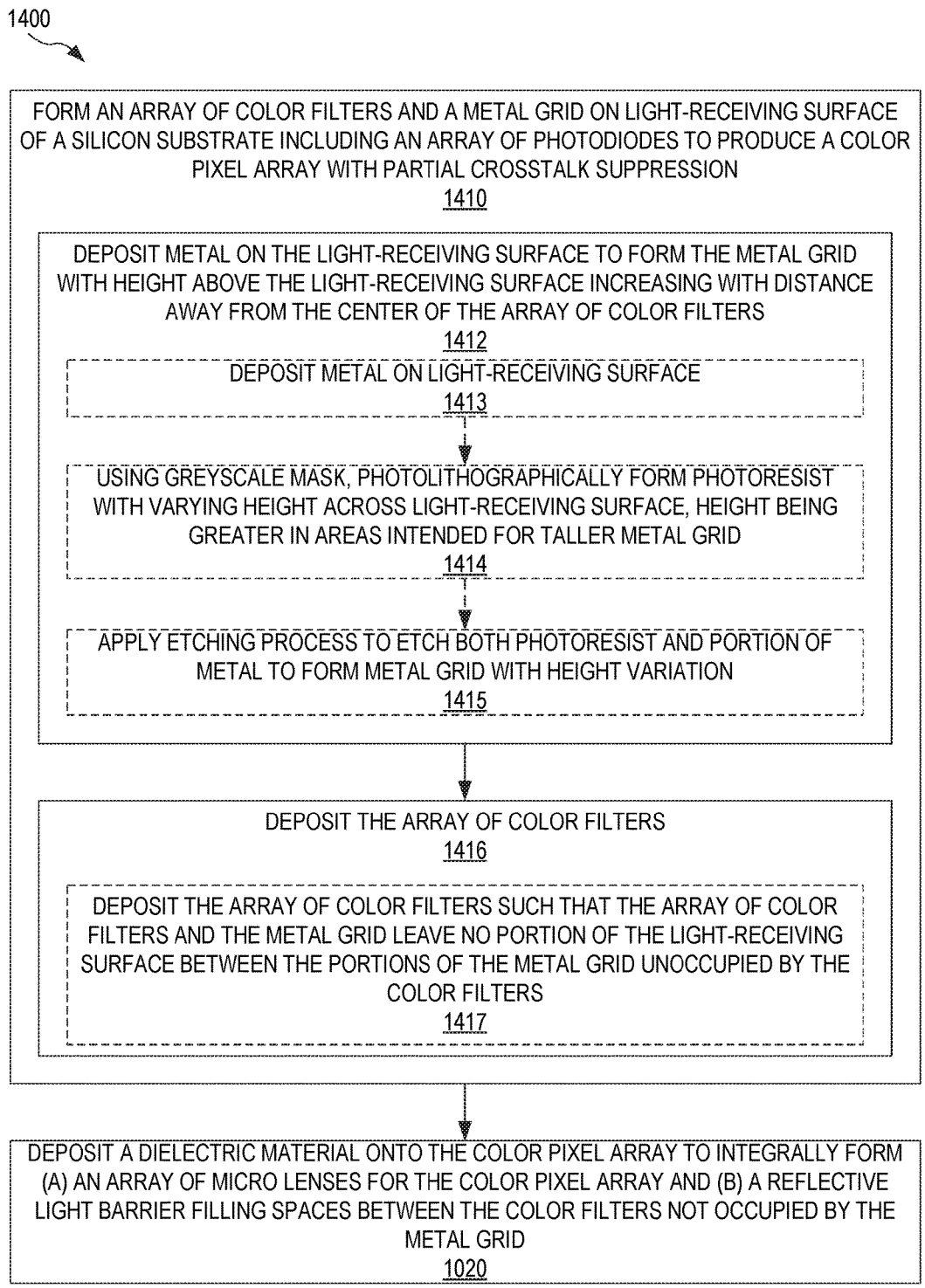
FIG. 14 illustrates another exemplary method for manufacturing a backside-illuminated color image sensor with a spatially non-uniform crosstalk-suppressing color filter array, according to an embodiment.

FIG. 14 illustrates another exemplary method 1400 for manufacturing a backside-illuminated color image sensor with a spatially non-uniform crosstalk-suppressing color filter array. Method 1400 is an embodiment of method 1000, which implements step 1010 as a step 1410.

Step 1410 includes a step 1412 of depositing metal on the light-receiving surface of the silicon substrate to form a metal grid. The height of this metal grid, above the light-receiving surface, increases with distance away from the center location of the array of color filters. In one example, step 1412 deposits metal light barrier grid 824 on light-receiving surface 118 as shown for color filter layer 800 in FIGS. 8A-G. Step 1410 also includes a step 1416 of depositing the array of color filters. In one example, step 1416 deposits color filters 822 as shown for color filter layer 800 in FIGS. 8A-E. Step 1416 may be performed before or after step 1412, without departing from the scope hereof.

In an embodiment, step 1412 utilizes photolithography with a greyscale mask and etching to produce the metal grid with a height gradient. In this embodiment, step 1412 includes steps 1413, 1414, and 1415. Step 1413 deposits metal on the light-receiving surface of the silicon substrate. The height of the metal layer above the light-receiving surface may be substantially uniform. In one example of step 1413, metal is deposited on light-receiving surface 118 of silicon layer 110. Step 1414 uses a greyscale mask to photolithographically form photoresist with varying height across the light-receiving surface. The greyscale mask allows for curing the photoresist with a variation in height. After step 1414, the light receiving surface has metal layer on the light-receiving surface and photoresist deposited on the metal layer. The height of the photoresist, above the metal layer, increases with distance away from the center location of color filter array. In one embodiment, photoresist is present only in areas that coincide with the intended locations of the metal grid, i.e., the photoresist forms a grid on the metal layer and the height of the grid increases with distance away from the center location of the color filter array. Step 1415 applies an etching process to the side of the silicon substrate that holds the metal layer and the photoresist. The etching process is applied to the full surface, regardless of whether the material exposed at the surface is metal or photoresist. The etching process continues until all photoresist has been removed and only a metal grid with the desired height remains. In one example of steps 1414 and 1415, the removal rate in step 1415 is the same for the photoresist and the metal layer, in which case, the height variation of the photoresist formed in step 1414 matches the intended height variation of the metal grid. In another example of steps 1414 and 1415, the removal rate in step 1415 depends on the material, and photoresist is not etched away at the same rate as the metal layer. In this example, the height variation of the photoresist formed in step 1414 is adjusted to compensate for the difference in removal rate between photoresist and metal.

In an alternate embodiment, not illustrated in FIG. 14, step 1413 is followed by, instead of steps 1414 and 1415, (a) a chemical-mechanical polishing step that grinds the metal layer to produce a height gradient (height increasing with distance away from the center), and (b) an etching step that etches away unwanted portions of the metal layer to form the metal grid with a height gradient.

In an embodiment, step 1416 implements a step 1417 of depositing the array of color filters such that, after completion of steps 1412 and 1416, the color filters occupy all portions of the light-receiving surface of the silicon substrate between portions of the metal grid. In one example of this embodiment, steps 1412, 1416, and 1417 cooperate to ensure that all areas of light-receiving surface 118 between portions of metal light barrier grid 824 are occupied by color filters 822, as shown for color filter layer 800 in FIGS. 8A-E.

After step 1410, method 1400 performs step 1020 as discussed above in reference to FIG. 10.

Figure 15A:
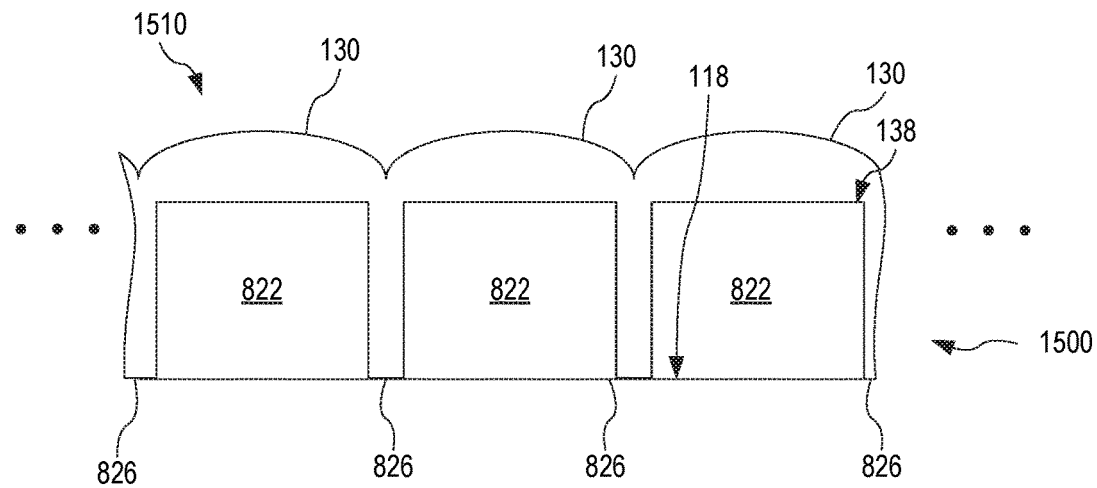
FIGS. 15A and 15B illustrate a crosstalk-suppressing color filter layer having (a) metal light barrier grid of spatially non-uniform height and (b) low-n material integrally formed with microlenses, according to an embodiment.
Figure 15B:
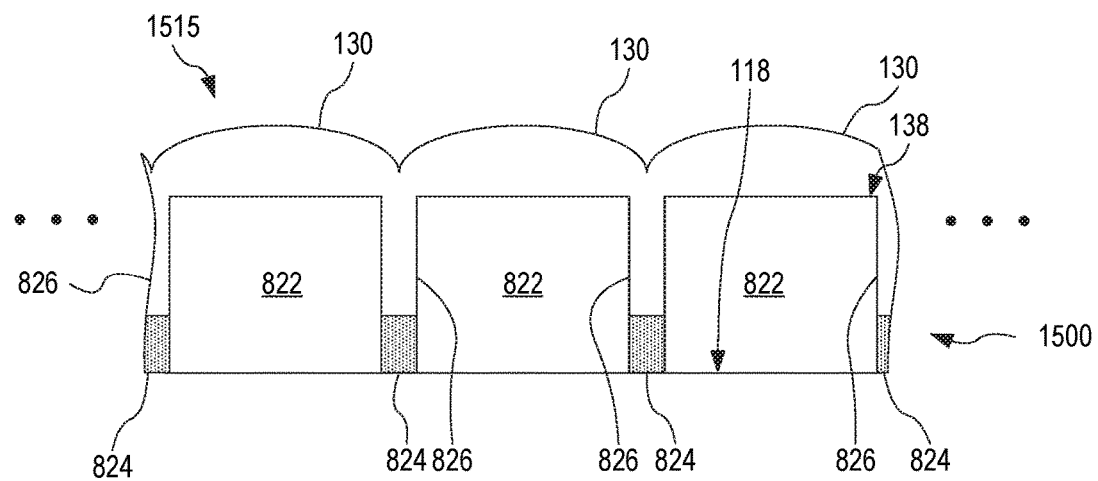

FIGS. 15A and 15B illustrate one exemplary crosstalk-suppressing color filter layer 1500 having (a) metal light barrier grid 824 of spatially non-uniform height and (b) low-n material 826 integrally formed with microlenses 130. Color filter layer 1500 together with integrally formed microlenses 130 forms an embodiment of color filter layer 800 combined with microlenses 130, and may be manufactured using an embodiment of method 1400 that implements step 1417. FIG. 15A shows a portion 1510 of color filter layer 1500 with integrally formed microlenses 130, which is at center 126, corresponding to portion 810 of color filter layer 800. FIG. 15B shows a portion 1515 of color filter layer 1500 with integrally formed microlenses 130, which is between center 126 and the periphery of color filter layer 1500, corresponding to portion 815 of color filter layer 800.

As compared to color filter layer 800, as shown in FIGS. 8B-E, low-n material 826 of color filter layer 1500 is integrally formed with microlenses 130.

Figure 16A:
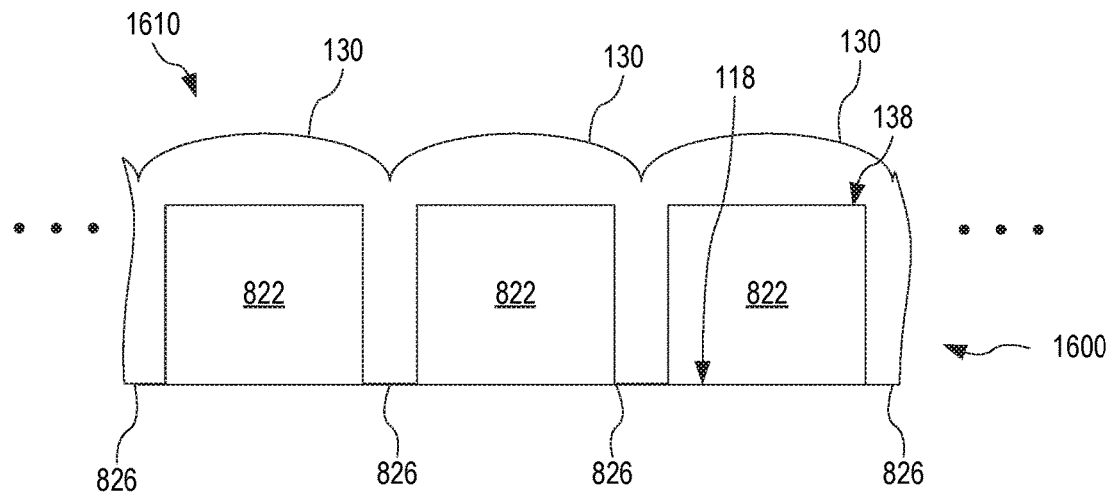
FIGS. 16A and 16B illustrate another crosstalk-suppressing color filter layer having (a) metal light barrier grid of spatially non-uniform height and (b) low-n material integrally formed with microlenses, according to an embodiment.
Figure 16B:
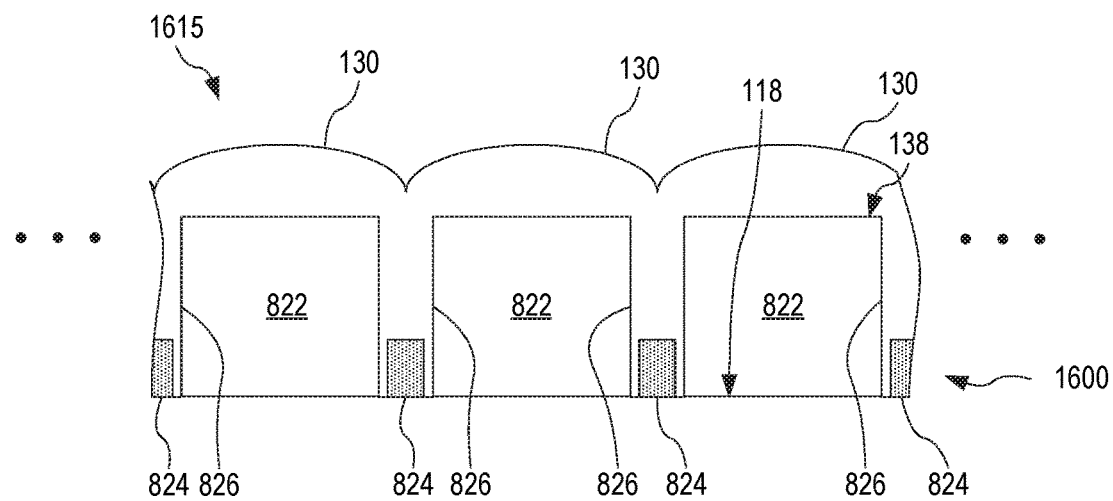

FIGS. 16A and 16B illustrate another exemplary crosstalk-suppressing color filter layer 1600 having (a) metal light barrier grid 824 of spatially non-uniform height and (b) low-n material 826 integrally formed with microlenses 130. Color filter layer 1600 together with integrally formed microlenses 130 forms an embodiment of color filter layer 900 combined with microlenses 130, and may be manufactured using an embodiment of method 1400 that does not implement step 1417. FIG. 16A shows a portion 1610 of color filter layer 1600 with integrally formed microlenses 130, which is at center 126, corresponding to portion 910 of color filter layer 900. FIG. 16B shows a portion 1615 of color filter layer 1600 with integrally formed microlenses 130, which is between center 126 and the periphery of color filter layer 1600, corresponding to portion 915 of color filter layer 900.

As compared to color filter layer 1600 with integrally formed microlenses 130, there is low-n material 826 on portions of light-receiving surface 118 between metal light barrier grid 824 and color filters 822.

FIG. 17 illustrates one exemplary method 1700 for manufacturing a backside-illuminated color image sensor with a crosstalk-suppressing color filter array, wherein low-n material of a crosstalk-suppressing light barrier grid and microlenses are formed separately. Method 1700 is an extension of method 1000 and may be used to manufacture image sensor 100, for example implementing color filter layer 600. Method 1700 includes step 1010 and two subsequent steps 1710 and 1720. As compared to method 1000, steps 1710 and 1720 replace step 1020.

Step 1710 deposits a first dielectric material on the color pixel array, produced in step 1010, to form a light barrier that fills spaces between the color filters not occupied by the metal grid. The first dielectric material is a low-n material and the light barrier provides crosstalk suppression by virtue of total internal reflection. In one example of step 1710, low-n material 526 is deposited on the side of silicon layer 110 associated with color filters 122, wherein silicon layer 110 already has color filters 122 and metal light barrier grid 424 disposed on light-receiving surface 118, as shown for color filter layer 600 in FIGS. 6B and 6C.

Step 1720 deposits a second dielectric material on the light-receiving surface of the color filter layer cooperatively formed by steps 1010 and 1710, to form an array of microlenses 130. In one example of step 1720, microlenses 130 are formed on color filter layer 600.

Method 1700 facilitates using different materials for the low-n material of the crosstalk-suppressing light barrier grid and the microlenses. Method 1700 thus enables separately optimizing the material choice for the crosstalk-suppressing light barrier grid and the microlenses. In one example, the low-n material of the crosstalk-suppressing light barrier grid is silicondioxide which has a low index of refraction of 1.46, while the microlenses are formed from an optical polymer with index of refraction between 1.5 and 1.55.

Without departing from the scope hereof, step 1020 in each of methods 1200 and 1400 may be replaced by steps 1710 and 1720.

Combinations of Features

Features described above as well as those claimed below may be combined in various ways without departing from the scope hereof. For example, it will be appreciated that aspects of one backside-illuminated color image sensor with crosstalk-suppressing color filter array, or associated method, described herein may incorporate or swap features of another backside-illuminated color image sensor with crosstalk-suppressing color filter array, or associated method, described herein. The following examples illustrate possible, non-limiting combinations of embodiments described above. It should be clear that many other changes and modifications may be made to the methods and device herein without departing from the spirit and scope of this invention:

(A1) A backside-illuminated color image sensor with crosstalk-suppressing color filter array may include a silicon layer having an array of photodiodes, and a color filter layer on the light-receiving surface of the silicon layer, wherein the color filter layer includes (a) an array of color filters cooperating with the array of photodiodes to form a respective array of color pixels and (b) a spatially non-uniform light barrier grid disposed between the color filters to suppress transmission of light between adjacent ones of the color filters.

(A2) In the backside-illuminated color image sensor denoted as (A1), the light barrier may be spatially non-uniform across the color filter layer to account for variation of chief ray angle across the array of color filters.

(A3) In either or both of the backside-illuminated color image sensors denoted as (A1) and (A2), the light barrier grid may include metal for absorbing light received from an adjacent one of the color filters, and a dielectric material, having lower index of refraction than the color filters and being at least partly transmissive to light, for reflecting light incident on the dielectric material, from an adjacent one of the color filters, at angles greater than critical angle for total internal reflection.

(A4) In the backside-illuminated color image sensor denoted as (A3), the ratio of the metal to the dielectric material, within the light barrier grid, may increase with distance away from center of the array of color filters to account for the dielectric material being a more effective reflector at greater angles of incidence.

(A5) Either or both of the backside-illuminated color image sensors denoted as (A3) and (A4) may further include a plurality of microlenses on light-receiving surface of the color filter layer.

(A6) In the backside-illuminated color image sensor denoted as (A5), the microlenses may be composed of the dielectric material.

(A7) In the backside-illuminated color image sensor denoted as (A6), the microlenses and the dielectric material of the light barrier may be integrally formed.

(A8) In any of the backside-illuminated color image sensors denoted as (A3) through (A7), the light barrier grid may include (i) a bottom layer disposed on the silicon layer and composed of the metal, wherein the extent of the bottom layer away from the silicon layer increases from a first height at the center to a second height at positions most distant from the center, and (ii) a top layer furthest from the silicon layer and extending to height of the color filters away from the silicon layer, wherein the top layer is composed of the dielectric material such that the dielectric material occupies spaces between the color filters not occupied by the metal.

(A9) In the backside-illuminated color image sensor denoted as (A8), the first height may be zero.

(A10) In either or both of the backside-illuminated color image sensors denoted as (A8) and (A9), for each pair of the color filters at least partly separated by the metal of the bottom layer, the metal may span the gap between the color filters of the pair in dimension parallel to light-receiving surface of the silicon layer and within the height of the bottom layer, to preclude the dielectric material from being disposed between the metal and the color filters.

(A11) In any of the backside-illuminated color image sensors denoted as (A3) through (A7), the width of the color filters, in dimensions parallel to the light-receiving surface of the silicon layer, may increase with distance away from the center to cause spacing between adjacent color filters to decrease from a first spacing at the center to a second spacing at positions most distant from the center.

(A12) In the backside-illuminated color image sensor denoted as (A11), the light barrier grid may implement (i) the metal as a contiguous metal grid disposed on the silicon layer and present between each pair of adjacent color filters and (ii) the dielectric material as spanning remaining gaps between the color filters.

(A13) In the backside-illuminated color image sensor denoted as (A12), the height of the contiguous metal grid above the silicon layer may be less than height of the color filters above the silicon layer.

(A14) In either or both of the backside-illuminated color image sensor denoted as (A12) and (A13), the contiguous metal grid may have same width, in the dimensions parallel to the light-receiving surface, between all pairs of adjacent color filters.

(A15) In any of the backside-illuminated color image sensors denoted as (A12) through (A14), the width of the metal grid may be greater than the second spacing.

(A16) In any of the backside-illuminated color image sensors denoted as (A12) through (A15), the width of the dielectric material, in the dimensions parallel to the light-receiving surface, between adjacent color filters may decrease with distance from the center.

(A17) In any of the backside-illuminated color image sensors denoted as (A12) through (A16), at positions most distant from the center, the color filters may be in direct contact with each other above the metal grid such that there is no dielectric material between adjacent color filters.

(B1) A method for manufacturing a backside-illuminated color image sensor with crosstalk-suppressing color filter array may include (a) forming an array of color filters and a metal grid on light-receiving surface of a silicon substrate including an array of photodiodes to produce a color pixel array, wherein the metal grid is disposed between at least some of the color filters to provide partial crosstalk suppression, and (b) depositing a first dielectric material, having lower index of refraction than the color filters, onto the color pixel array to integrally form (i) an array of microlenses for the color pixel array and (ii) a total-internal-reflection based light barrier filling spaces between the color filters not occupied by the metal grid.

(B2) In the method denoted as (B1), the step of forming may include depositing metal on the light-receiving surface to form the metal grid, and after the step of depositing metal, depositing the array of color filters with width, in dimensions parallel to the light-receiving surface, increasing with distance away from center of the array of color filters.

(B3) In the method denoted as (B2), the step of depositing the array of color filters may include producing the array of color filters with spacing between adjacent color filters at the center being same as width of the metal grid at the center and with zero spacing between adjacent color filters at positions most distant from the center.

(B4) In the method denoted as (B1), the step of forming may include depositing metal on the light-receiving surface to form the metal grid with height above the light-receiving surface increasing with distance away from the center.

(B5) In the method denoted as (B4), the step of forming may further include depositing the array of color filters to leave no portion of the light-receiving surface between the color filters unoccupied by the metal.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present methods and systems, which, as a matter of language, might be said to fall therebetween.

What is claimed is:

1. A backside-illuminated color image sensor with cross-talk-suppressing color filter array, comprising:
    a silicon layer including an array of photodiodes; and
    a color filter layer on light-receiving surface of the silicon layer, the color filter layer including:
        (a) an array of color filters cooperating with the array of photodiodes to form a respective array of color pixels, and
        (b) a light barrier grid disposed between the color filters to suppress transmission of light between adjacent ones of the color filters, the light barrier grid being spatially non-uniform across the color filter layer, in dimensions parallel to the light-receiving surface, to account for variation of chief ray angle across the array of color filters, the light barrier grid including metal and a dielectric material, the dielectric material having lower index of refraction than the color filters and being at least partly light transmissive, amount of the dielectric material being greater at center of the array of color filters than at periphery of the array of color filters,
    the light barrier grid comprising: the metal being configured to absorb light received from an adjacent one of the color filters, and the dielectric material being configured to reflecting light incident on the dielectric material, from an adjacent one of the color filters, at angles greater than critical angle for total internal reflection,
    ratio of the metal to the dielectric material, within the light barrier grid, increasing with distance away from the center to account for the dielectric material being a more effective reflector at greater angles of incidence, the distance being in dimensions parallel to the light-receiving surface of the silicon layer,
    width of the color filters, in dimensions parallel to the light-receiving surface of the silicon layer, increasing with the distance away from the center to cause spacing between adjacent color filters to decrease from a first spacing at the center to a second spacing at positions most distant from the center, the light barrier grid implementing (i) the metal as a contiguous metal grid disposed on the silicon layer and present between each pair of adjacent color filters and (ii) the dielectric material as spanning remaining gaps between the color filters.

2. The backside-illuminated color image sensor of claim 1, further comprising a plurality of microlenses on light-receiving surface of the color filter layer, the microlenses being composed of the dielectric material and integrally formed with the dielectric material of the light barrier.

3. The backside-illuminated color image sensor of claim 1, height of the contiguous metal grid above the silicon layer being less than height of the color filters above the silicon layer.

4. The backside-illuminated color image sensor of claim 1, the contiguous metal grid having same width, in the dimensions parallel to the light-receiving surface, between all pairs of adjacent color filters.

5. The backside-illuminated color image sensor of claim 4, the width of the metal grid being greater than the second spacing.

6. The backside-illuminated color image sensor of claim 5, width of the dielectric material between adjacent color filters, in the dimensions parallel to the light-receiving surface, decreasing with the distance away from the center.

7. The backside-illuminated color image sensor of claim 6, at positions most distant from the center, the color filters being in direct contact with each other above the metal grid such that there is no dielectric material between adjacent color filters.

8. The backside-illuminated color image sensor of claim 1, further comprising a plurality of microlenses on light-receiving surface of the color filter layer.

9. The backside-illuminated color image sensor of claim 8, the microlenses being composed of the dielectric material.

10. The backside-illuminated color image sensor of claim 1, the microlenses and the dielectric material of the color filter layer being integrally formed.

* * * * *